(12) United States Patent
Ohnuma et al.

(10) Patent No.: US 8,143,118 B2
(45) Date of Patent: Mar. 27, 2012

(54) TFT DEVICE WITH CHANNEL REGION ABOVE CONVEX INSULATOR PORTIONS AND SOURCE/DRAIN IN CONCAVE BETWEEN CONVEX INSULATOR PORTIONS

(75) Inventors: Hideto Ohnuma, Atsugi (JP); Atsuo Isobe, Isehara (JP); Hiromichi Godo, Atsugi (JP)

(73) Assignee: Semiconductor Energy Laboratory Co., Ltd., Atsuhi-shi, Kanagawa-ken (JP)

( * ) Notice: Subject to any disclaimer, the term of this patent is extended or adjusted under 35 U.S.C. 154(b) by 510 days.

(21) Appl. No.: 12/073,618

(22) Filed: Mar. 7, 2008

(65) Prior Publication Data

US 2008/0220570 A1    Sep. 11, 2008

(30) Foreign Application Priority Data

Mar. 8, 2007   (JP) .................. 2007-058582

(51) Int. Cl.
    *H01L 21/84*    (2006.01)
(52) U.S. Cl. ........ 438/166; 438/149; 438/151; 438/164; 438/484; 438/486; 438/487; 438/497; 438/500; 257/E29.295
(58) Field of Classification Search .................. 438/151, 438/166; 257/59, E29.295
    See application file for complete search history.

(56) References Cited

U.S. PATENT DOCUMENTS

| | | | |
|---|---|---|---|
| 5,498,904 A | 3/1996 | Harata et al. | |
| 5,656,825 A * | 8/1997 | Kusumoto et al. | ............. 257/66 |
| 6,335,232 B1 * | 1/2002 | Ohori et al. | ............. 438/158 |
| 6,653,657 B2 * | 11/2003 | Kawasaki et al. | ............. 257/69 |
| 6,841,797 B2 | 1/2005 | Isobe et al. | |
| 6,911,358 B2 | 6/2005 | Azami et al. | |
| 6,933,527 B2 * | 8/2005 | Isobe et al. | ............. 257/59 |
| 7,105,392 B2 | 9/2006 | Isobe et al. | |
| 7,115,903 B2 | 10/2006 | Isobe et al. | |
| 7,148,092 B2 | 12/2006 | Isobe et al. | |

(Continued)

FOREIGN PATENT DOCUMENTS

JP    61-048975    3/1986
(Continued)

OTHER PUBLICATIONS

He et al. "Raised Source and Drain Structure of Poly-Si TFTs," Electrochemical Society Proceedings, vol. 98-22, pp. 204-220.

*Primary Examiner* — N Drew Richards
*Assistant Examiner* — John P Dulka
(74) *Attorney, Agent, or Firm* — Eric J. Robinson; Robinson Intellectual Property Law Office, P.C.

(57) ABSTRACT

A semiconductor device having a highly responsive thin film transistor (TFT) with low subthreshold swing and suppressed decrease in the on-state current and a manufacturing method thereof are demonstrated. The TFT of the present invention is characterized by its semiconductor layer where the thickness of the source region or the drain region is larger than that of the channel formation region. Manufacture of the TFT is readily achieved by the formation of an amorphous semiconductor layer on a projection portion and a depression portion, which is followed by subjecting the melting process of the semiconductor layer, resulting in the formation of a crystalline semiconductor layer having different thicknesses. Selective addition of impurity to the thick portion of the semiconductor layer provides a semiconductor layer in which the channel formation region is thinner than the source or drain region.

22 Claims, 16 Drawing Sheets

U.S. PATENT DOCUMENTS

| | | |
|---|---|---|
| 7,189,997 B2 | 3/2007 | Tsunoda et al. |
| 7,238,557 B2 | 7/2007 | Hayakawa |
| 7,259,045 B2 | 8/2007 | Dejima |
| 7,312,473 B2 | 12/2007 | Koyama et al. |
| 8,048,749 B2 * | 11/2011 | Yokoi et al. .................... 438/293 |
| 2003/0141505 A1 * | 7/2003 | Isobe et al. ...................... 257/66 |
| 2003/0218171 A1 | 11/2003 | Isobe et al. |
| 2004/0140470 A1 * | 7/2004 | Kawasaki et al. ............... 257/72 |
| 2005/0161742 A1 * | 7/2005 | Isobe et al. .................... 257/347 |
| 2006/0009013 A1 * | 1/2006 | Chen et al. .................... 438/486 |
| 2007/0015323 A1 | 1/2007 | Isobe et al. |
| 2007/0085080 A1 | 4/2007 | Isobe et al. |
| 2009/0029514 A1 * | 1/2009 | Yokoi et al. .................... 438/293 |

FOREIGN PATENT DOCUMENTS

| | | |
|---|---|---|
| JP | 02-076264 | 3/1990 |
| JP | 05-013762 | 1/1993 |
| JP | 05-110099 | 4/1993 |
| JP | 05-198594 | 8/1993 |
| JP | 09-036376 | 2/1997 |
| JP | 2003-203920 | 7/2003 |

* cited by examiner

Scanning direction of the linear beam

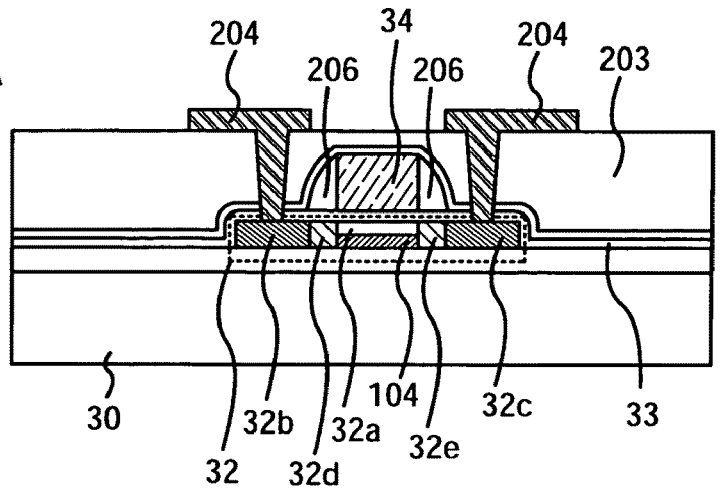
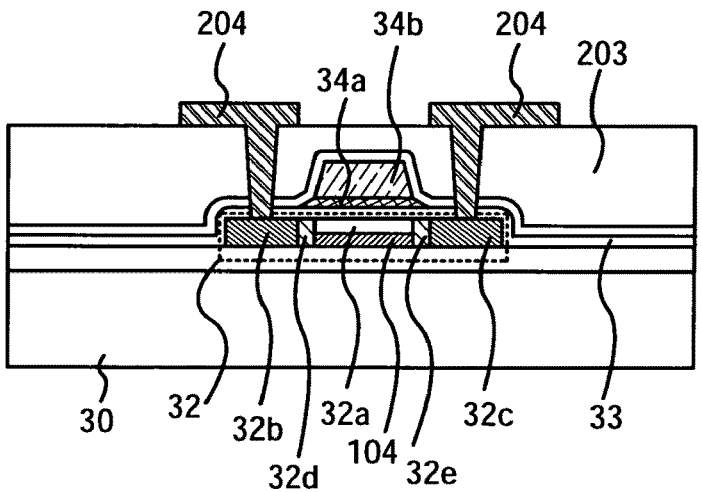
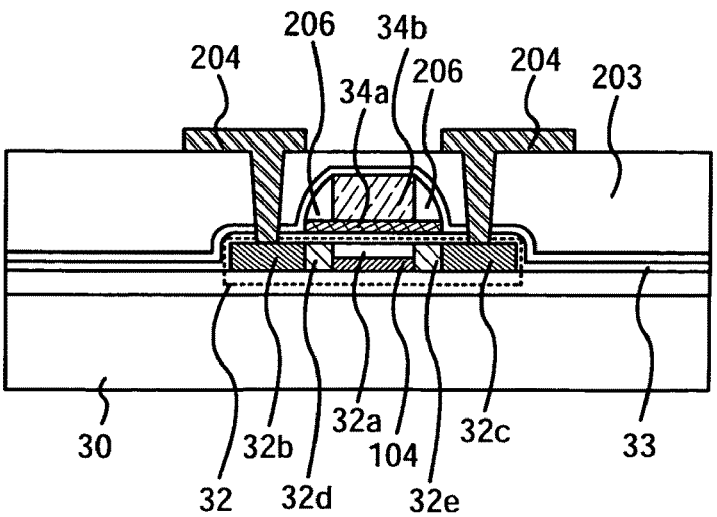

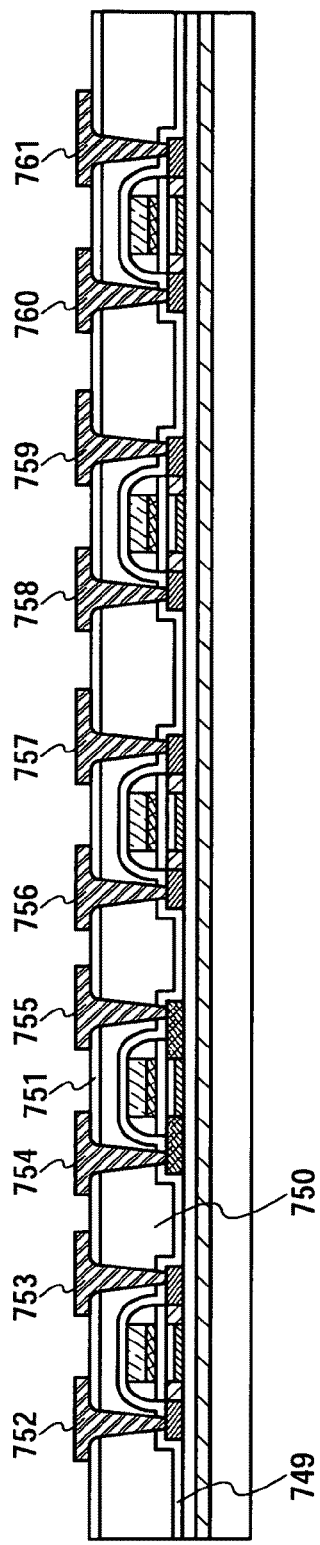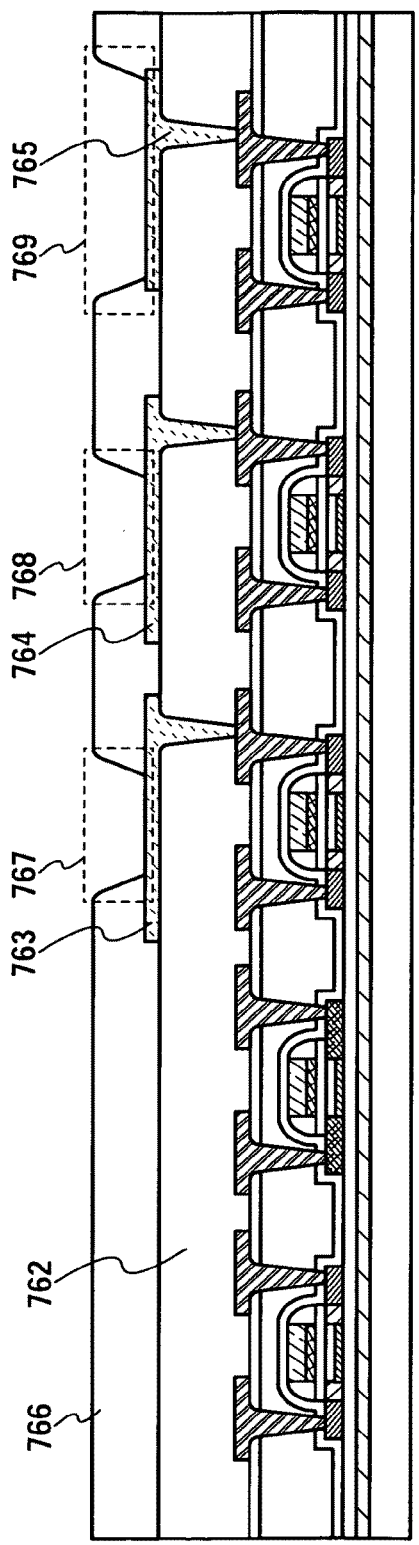
FIG. 9A
FIG. 9B

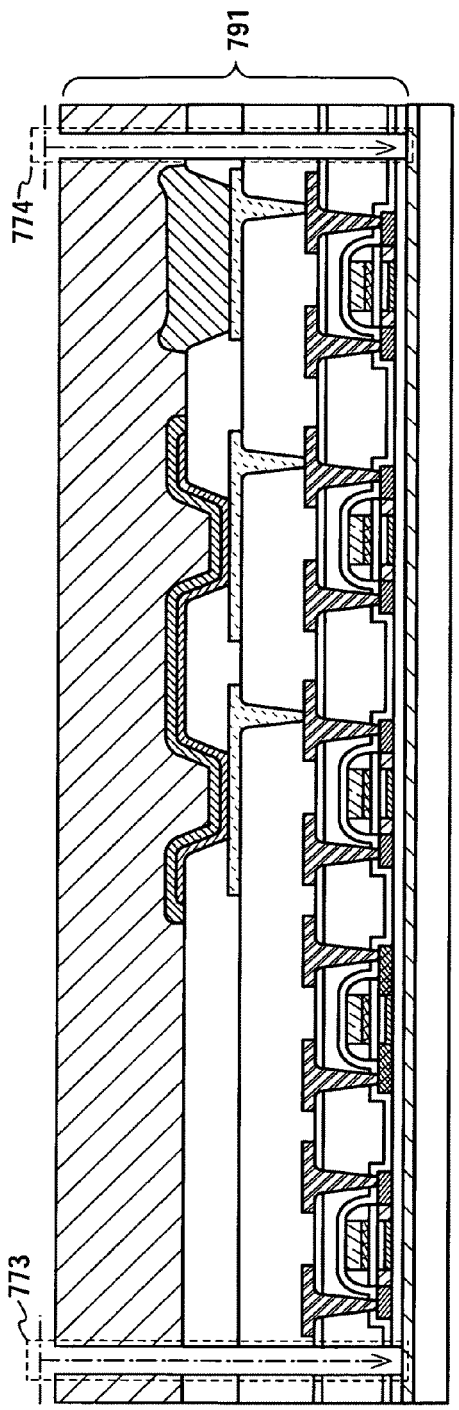
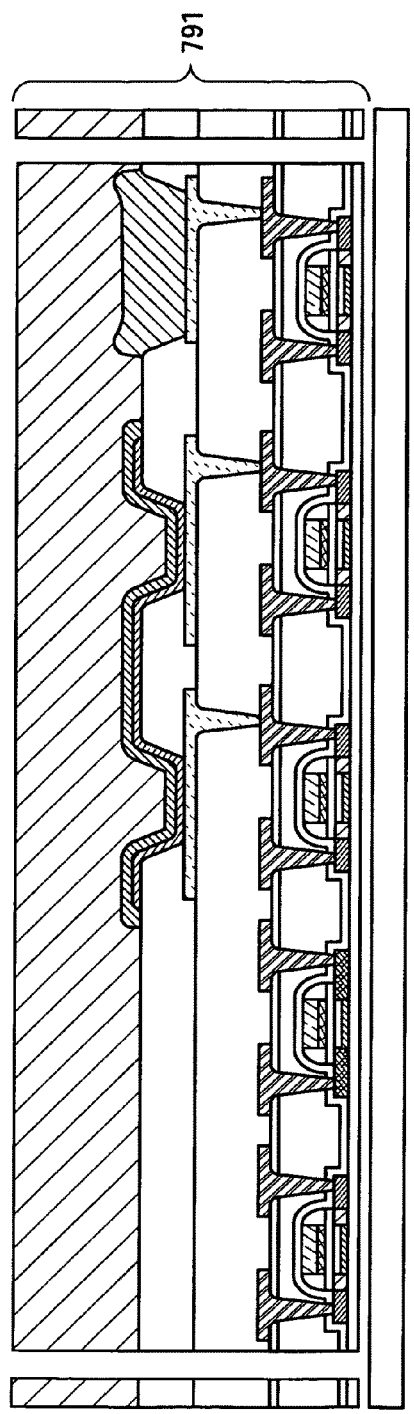
FIG. 11A
FIG. 11B

TFT DEVICE WITH CHANNEL REGION ABOVE CONVEX INSULATOR PORTIONS AND SOURCE/DRAIN IN CONCAVE BETWEEN CONVEX INSULATOR PORTIONS

BACKGROUND OF THE INVENTION

1. Field of the Invention

The present invention relates to a semiconductor device and a manufacturing method thereof.

2. Description of the Related Art

In recent years, manufacturing of semiconductor devices in which thin film transistors (hereinafter referred to as TFTs) formed over insulating surfaces of substrates such as glass are utilized as switching elements or the like has been actively pursued. For these thin film transistors, a structure is proposed in which island-shaped semiconductor layers are formed over a substrate having an insulating surface by a CVD method, a photolithography method, or the like, and a part of the island-shaped semiconductor layers is utilized as a channel formation region.

In such a situation, in order to improve characteristics of a thin film transistor, a method for forming a thin film transistor is proposed in which subthreshold swing (here, the subthreshold swing (S value) is referred to as a gate voltage value in a subthreshold region while a drain current changes by one digit while a drain voltage is constant) is lowered by reducing the thickness of a semiconductor layer. However, there have been problems such that the resistance of each of a source region and a drain region and the contact resistance are increased by reducing the thickness of the semiconductor layer, which leads to a decrease in the on-state current.

In order to solve these problems, a thin film transistor formed using a semiconductor layer in which the thickness of a channel formation region is smaller than the thickness of a source region or a drain region is proposed (e.g., Patent Document 1: Japanese Published Patent Application No. S61-48975, Patent Document 2: Japanese Published Patent Application No. H5-110099, and Non-Patent Document 1: Electrochemical Society Proceedings Volume 98-22, PP. 204-220). For example, Patent Document 1 discloses a method for forming a thin film transistor in which a semiconductor layer is formed on a flat surface of an insulating substrate and the channel formation region is locally thinned by performing selective etching. Patent Document 2 discloses a method in which a semiconductor layer is formed over an insulating substrate provided with a protrusion in a portion corresponding to a channel formation region and an upper surface of the semiconductor layer formed over the protrusion is etched so that the semiconductor layer is planarized to thin the channel formation region. Non-Patent Document 1 discloses a method for manufacturing a thin film transistor in which a part of an n$^+$Si film is dry etched after the n$^+$Si film is deposited over a p$^-$Si film. In this method, a portion where the p$^-$Si film and the n$^+$Si film are stacked is used as a source region or a drain region, and the p$^-$Si film under the etched n$^+$Si film is used as a channel formation region.

However, as described in Patent Document 1, there is a problem in that the fabrication process is unstable because the formation of a semiconductor layer having different thicknesses on a flat surface of an insulating substrate requires selective etching of the semiconductor layer to form a channel formation region with a desired thickness. In the method described in Patent Document 2, there is a problem in that the number of steps is increased because etching treatment is performed in order to planarize the surface of a semiconductor layer and a process is unstable because selective etching treatment of the semiconductor layer is required to form the semiconductor layer with a planarized surface. In the method described in Non-Patent Document 1, etching is necessary after an Si film is deposited twice, and hence the number of steps is increased. In particular, in the case where an n-channel transistor and a p-channel transistor are formed, the number of depositions of Si films and the number of etching processes are increased further. In addition, there is a problem in that a process is unstable because well-controlled etching treatment of the Si film is required. Particularly, it is quite difficult to control the thickness of the semiconductor layer in an attempt to fabricate the channel formation region with a thickness of 50 nm or less.

SUMMARY OF THE INVENTION

The present invention provides a technique to solve such problems, and an object of the present invention is to propose a method for manufacturing a highly responsive semiconductor device, in which subthreshold swing is low and a decrease in the on-state current is suppressed, without performing a complicated process.

A semiconductor device of the present invention is manufactured in such a way that the thickness of a source region or a drain region is larger than the thickness of a channel formation region. As a method for manufacturing such a semiconductor device, first, an amorphous semiconductor layer is formed over a projection portion and a depression portion which are formed of an insulating layer provided over a substrate. Next, the amorphous semiconductor layer is irradiated with a laser beam to result in a crystalline semiconductor layer having different thicknesses. Then, a source region or a drain region is formed by adding an impurity to a thick portion of the crystalline semiconductor layer. A region that is not doped with the impurity is used as a channel formation region. A wiring which is electrically connected to the source region or the drain region is formed, whereby a semiconductor device of the present invention can be manufactured.

The semiconductor device of the present invention includes a first insulating layer having a projection portion which is formed over a substrate in an area corresponding to at least a channel formation region, a crystalline semiconductor layer which is formed by melting an amorphous semiconductor layer provided over the first insulating layer, a second insulating layer formed over the crystalline semiconductor layer, a gate electrode formed over the second insulating layer, a third insulating layer formed over the gate electrode, and a wiring which is electrically connected to the source region or the drain region through a contact hole formed in the third insulating layer. The channel formation region is formed over the projection portion of the first insulating layer, and the source region or the drain region is formed over a depression portion of the first insulating layer.

A semiconductor device of the present invention can be manufactured in such a way that a first insulating layer having a projection portion is formed in an area corresponding to at least a channel formation region, an amorphous semiconductor layer is formed over the first insulating layer, the amorphous semiconductor layer is irradiated with a laser beam to form a crystalline semiconductor layer, an impurity is added to the crystalline semiconductor layer formed over a depression portion of the first insulating layer to form a source region or a drain region, a second insulating layer is formed over the crystalline semiconductor layer, a gate electrode is formed over the crystalline semiconductor layer formed over the projection portion with the second insulating layer interposed therebetween, a third insulating layer is formed over the gate electrode and the source region or the drain region, a contact hole exposing the source region or the drain region is formed in the third insulating layer, and a conductive layer which is connected to the source region or the drain region is formed over the third insulating layer. Note that the first insulating layer may be formed only in the area corresponding to the channel formation region over the substrate. In such a case, a projection portion and a depression portion are formed by using the substrate and the first insulating layer, whereby a semiconductor layer having different thicknesses can be formed.

In a semiconductor device of the present invention, the thickness of a source region or a drain region is arranged to be larger than the thickness of a channel formation region. This feature is achieved by melting the semiconductor layer formed over an insulating layer provided with a projection portion and a depression portion to planarize the surface of the semiconductor layer. Therefore, the semiconductor device in which subthreshold swing is low and a decrease in the on-state current is suppressed can be manufactured. In addition, since the surface of the semiconductor layer is planarized by melting the semiconductor layer, a semiconductor device can be easily manufactured without increasing the number of processes.

Accordingly, in the present invention, a semiconductor device in which subthreshold swing is low and a decrease in the on-state current is suppressed and which has a good response can be easily manufactured.

BRIEF DESCRIPTION OF THE DRAWINGS

FIGS. 6A to 6C are diagrams illustrating a structure of a thin film transistor of the present invention.

FIGS. 9A and 9B are cross-sectional views illustrating a manufacturing process of a semiconductor device of the present invention.

FIGS. 11A and 11B are cross-sectional views illustrating a manufacturing process of a semiconductor device of the present invention.

DETAILED DESCRIPTION OF THE INVENTION

Figure 1A:
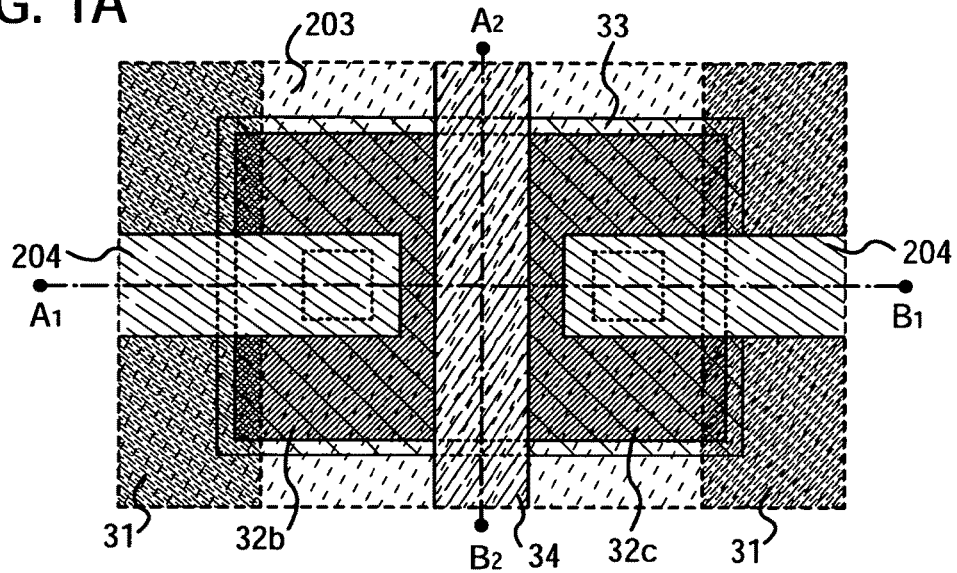
FIG. 1A is a top view and FIGS. 1B and 1C are cross-sectional views illustrating a structure of a semiconductor device of the present invention.

Hereinafter, embodiment modes of the present invention will be described using the accompanying drawings. However, the present invention should not be taken as being limited to the following description. As can be easily understood by those skilled in the art, the modes and details of the present invention can be changed in various ways without departing from the spirit and scope of the present invention. Thus, the present invention should not be interpreted as being limited to the following description of the embodiment modes. Note that the same reference numerals are used in common to denote the same components among different drawings in structures of the present invention explained below.

Embodiment Mode 1

In this embodiment mode, a structure of a semiconductor device formed using a semiconductor layer in which the thickness of a source region or a drain region is larger than the thickness of a channel formation region and a manufacturing method thereof will be described.

Figure 1B:
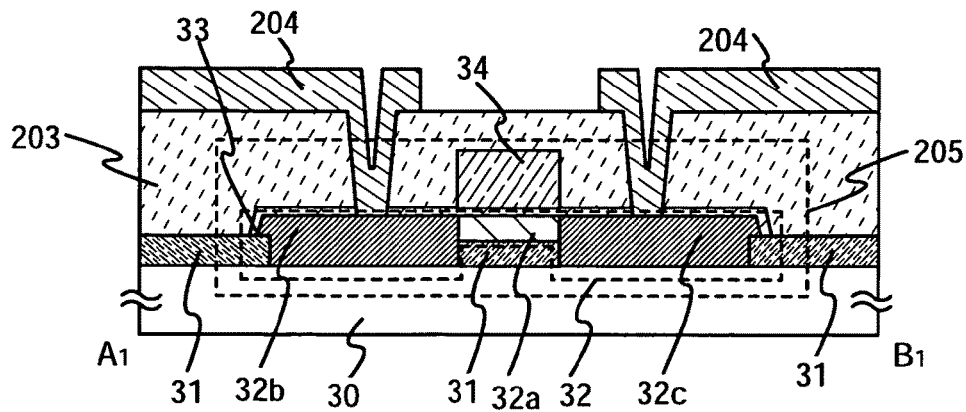
Figure 1C:
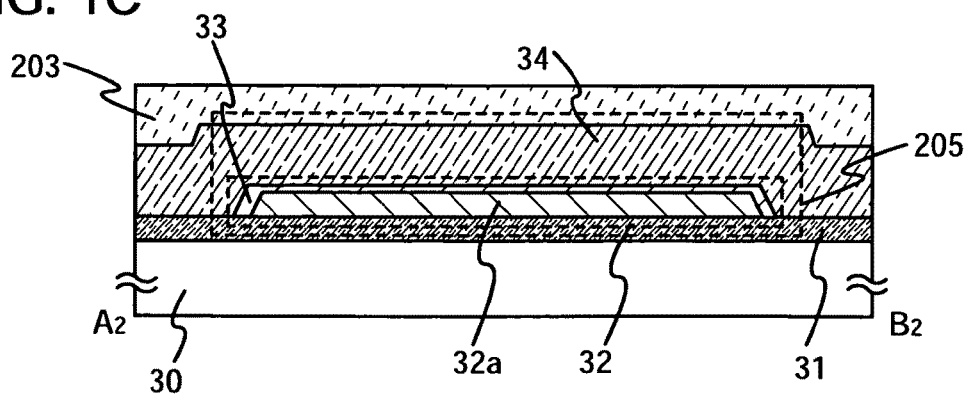

FIG. 1A is a top view and FIGS. 1B and 1C are cross-sectional views used to describe a structure of a semiconductor device of the present invention. FIG. 1A is a top view of a semiconductor device formed using a thin film transistor. FIG. 1B is a cross-sectional view taken along a dashed line connecting a point $A_1$ and a point $B_1$ of FIG. 1A. FIG. 1C is a cross-sectional view taken along a dashed line connecting a point $A_2$ and a point $B_2$ of FIG. 1A.

The semiconductor device given in this embodiment mode includes a thin film transistor 205 having an insulating layer 31 which is provided such that a projection portion and a depression portion are formed over a substrate 30, an island-shaped semiconductor layer 32 provided over the substrate 30 and the insulating layer 31, a gate insulating layer 33 formed over the semiconductor layer 32, and a conductive layer 34 functioning as a gate electrode which is provided over the semiconductor layer 32 with the gate insulating layer 33 interposed therebetween; an insulating layer 203 which is provided to cover the gate insulating layer 33 and the conductive layer 34; and a conductive layer 204 functioning as a source electrode or a drain electrode provided over the insulating layer 203 (FIGS. 1A to 1C). Note that the semiconductor layer 32 includes a channel formation region 32a and impurity regions 32b and 32c which each function as a source region or a drain region. Note also that an impurity which is the same as that added to the impurity regions 32b and 32c or an impurity which provides a conductivity type opposite to that of the impurity regions 32b and 32c may be added to the channel formation region 32a. Note also that an insulating layer may be formed between the substrate 30 and the insulating layer 31.

In the semiconductor device shown in FIGS. 1A to 1C, a projection portion and a depression portion are formed by the difference in height between the substrate 30 and the insulating layer 31, which results in the variation of the thickness of the semiconductor layer 32 formed thereover. In this embodiment mode, because the semiconductor layer, which is formed over the projection portion and the depression portion formed using the insulating layer 31 over the substrate 30, is melted to give a planarized surface of the semiconductor layer 32, a semiconductor layer in which the thickness of each of the impurity regions 32b and 32c each functioning as a source region or a drain region is thicker than the thickness of the channel formation region 32a can be formed. The large thickness of the source region or the drain region compared with that of the channel formation region provides an advantage to the recovery of crystallinity in the heat treatment which is conducted for thermal activation of an impurity element after the addition of the impurity element by an ion doping method or the like. Since recovery of crystallinity proceeds effectively, an increase in resistance of the source region or the drain region can be suppressed. Additionally, subthreshold swing can be lowered, and a decrease in the on-state current can be suppressed because the thickness of the source region or the drain region is larger than that of the source region or the drain region. Since the semiconductor layer is planarized by melting the semiconductor layer, a semiconductor device can be manufactured easily without increasing the number of processes. Accordingly, a semiconductor device in which subthreshold swing is low and a decrease in the on-state current is suppressed and which has a good response can be manufactured.

An example of a method for manufacturing a semiconductor device shown in FIGS. 1A to 1C will be described hereinafter. FIGS. 2A and 2B, FIGS. 3A and 3B, and FIG. 4 are schematic views in which a manufacturing process of a semiconductor device of this embodiment mode is observed from an oblique direction.

Figure 2A:
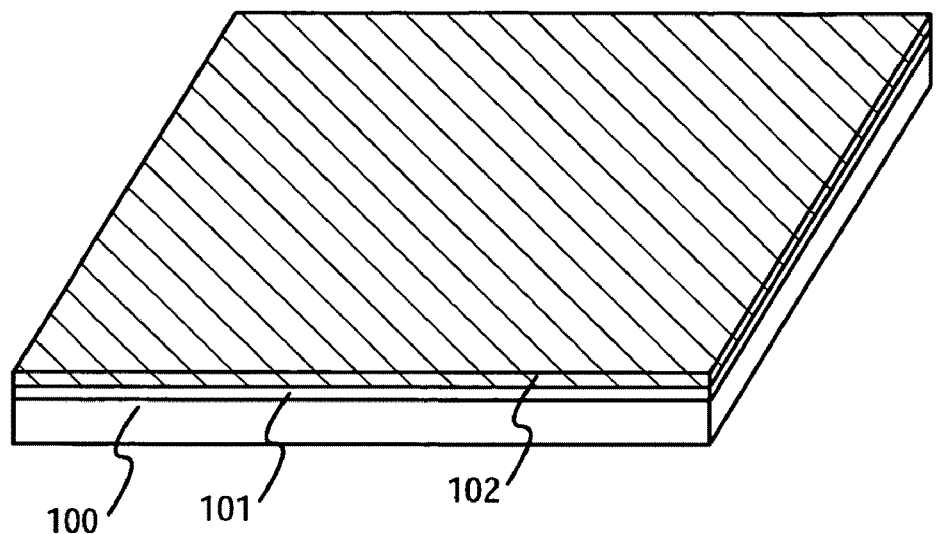
FIGS. 2A and 2B are diagrams illustrating a manufacturing process of a semiconductor device of the present invention.
Figure 2B:
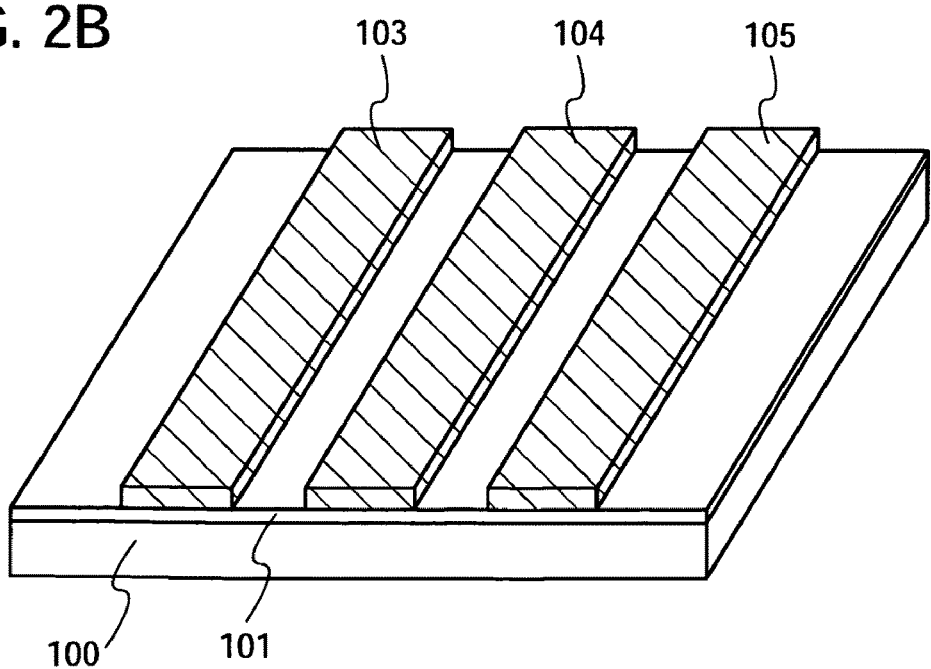

First, a first insulating layer 101 is formed over a substrate 100, and a second insulating layer 102 is formed over the first insulating layer 101 (FIG. 2A), Next, the second insulating layer 102 is etched, and second insulating layers 103 to 105 are formed over the first insulating layer 101 in a linear stripe pattern (FIG. 2B). The etching of the second insulating layer 102 can be performed using buffered hydrofluoric acid or dry etching using $CHF_3$, for example. Note that in FIG. 2B, although three linear stripe patterns formed from the second insulating layer 102 are shown, the number of linear stripe patterns is not limited thereto.

Here, as the substrate 100, a glass substrate, a quartz substrate, a metal substrate (for example, a stainless-steel substrate or the like), a ceramic substrate, a semiconductor substrate such as an Si substrate, or the like can be used. Alternatively, a plastic substrate formed of poly(ethylene terephthalate) (PET), poly(ethylene naphthalate) (PEN), poly (ether sulfone) (PES), acrylic polymer, or the like can be used. Note that, to form a linear stripe pattern in accordance with a submicron design rule, it is desirable that a projection portion and a depression portion of a substrate surface or twisting or distortion of the substrate be less than or equal to the depth of focus of an exposure apparatus (in particular, a stepper). Specifically, it is preferable that twisting or distortion of the substrate be less than or equal to 1 μm, preferably less than or equal to 0.5 μm, in a region irradiated with light by one shot with the exposure apparatus.

The shapes of the second insulating layers 103 to 105 need not necessarily be regular periodic patterns and may be formed as appropriate in accordance with the shape of a semiconductor layer to be formed later. Accordingly, there is no particular numerical limitation on the width and the length of each of the second insulating layers 103 to 105, and the second insulating layers 103 to 105 may be formed in an area corresponding to at least a channel formation region of a TFT to be formed later. In addition, an angle of a side surface of a depression portion formed between the first insulating layer 101 and the second insulating layers 103 to 105 may be set in the range of 5 to 120 degrees, preferably, 60 to 90 degrees, as appropriate. Further, corners of the second insulating layers 103 to 105 or step portions formed by the first insulating layer 101 and the second insulating layers 103 to 105 need not necessarily be shapes formed by straight lines but may be round shapes. In FIGS. 16A to 16D, examples of shapes of the first insulating layer 101 and the second insulating layers 103 to 105 in the structure of the semiconductor device of this embodiment mode are shown. As shown in FIGS. 16A to 16D, the first insulating layer 101 and the second insulating layers 103 to 105 can each be formed into various shapes.

Here, the first insulating layer 101 may be formed of a material which can provide high etching selectivity between the first insulating layer 101 and the second insulating layer 102. It is desirable that a material and film formation conditions be adjusted as appropriate so that an etching rate of the second insulating layer 102 be relatively faster than that of the first insulating layer 101. For example, as the first insulating layer 101, a material such as silicon nitride, silicon oxide, silicon oxynitride (referred to as $SiO_xN_y$) whose oxygen content is greater than its nitrogen, silicon nitride oxide (referred to as $SiN_xO_y$) whose nitrogen content is greater than its oxygen, aluminum nitride (referred to as $Al_xN_y$), aluminum oxynitride (referred to as $AlO_xN_y$) whose oxygen content is greater than its nitrogen, aluminum nitride oxide (referred to as $AlN_xO_y$) whose nitrogen content is greater than its oxygen, or aluminum oxide can be used. In this case, the first insulating layer 101 may be formed at a thickness of 30 nm to 300 nm. In particular, a blocking effect against sodium (Na) is obtained when an aluminum oxide film is used as the first insulating layer 101, which provides an advantageous effect as a countermeasure against contamination from a glass substrate. Note that the first insulating layer 101 need not necessarily be provided but may be provided as appropriate, if necessary. The first insulating layer 101 and the second insulating layer 102 need not necessarily be formed of different materials but may be formed of the same material. Further, the first insulating layer 101 or the second insulating layer 102 need not necessarily be a single layer but may have a structure in which a plurality of layers is stacked.

Note that a silicon oxynitride ($SiO_xN_y$) film may contain Si at 25 at. % to 35 at. %, oxygen at 55 at. % to 65 at. %, nitrogen at 1 at. % to 20 at. %, and hydrogen at 0.1 at. % to 10 at. %. A silicon nitride oxide ($SiN_xO_y$) film may contain Si at 25 at. % to 35 at. %, oxygen at 15 at. % to 30 at. %, nitrogen at 20 at. % to 35 at. %, and hydrogen at 15 at. % to 25 at. %. An aluminum oxynitride ($AlO_xN_y$) film may contain Al at 30 at. % to 40 at. %, oxygen at 50 at. % to 70 at. %, and nitrogen at 1 at. % to 20 at. %. An aluminum nitride oxide ($AlN_xO_y$) film may contain Al 30 at. % to 50 at. %, oxygen at 0.01 at. % to 20 at. %, and nitrogen at 30 at. % to 50 at. %.

The second insulating layer 102 can be formed using silicon oxide, silicon nitride oxide, silicon oxynitride, or the like, at a thickness of 10 nm to 3000 nm, preferably, 10 nm to 200 nm, more preferably, 20 nm to 100 nm. A silicon oxide film can be formed in an atmosphere, in which tetraethyl orthosilicate (TEOS) and $O_2$ are mixed, by a plasma CVD method. A silicon nitride oxide film can be formed by a plasma CVD method using $SiH_4$, $NH_3$, and $N_2O$ as raw materials. A silicon oxynitride film can be formed by a plasma CVD method using $SiH_4$ and $N_2O$ as raw materials. Note that for the second insulating layer 102, an insulating film formed by a CVD method (typically, a plasma CVD method or a thermal CVD method) or a PVD method (typically, a sputtering method or an evaporation method) is preferably used. This is because a soft insulating layer that can relax stress associated with crystallization is considered to play an important role in obtaining good crystallinity when an amorphous semiconductor layer is crystallized.

Figure 3A:
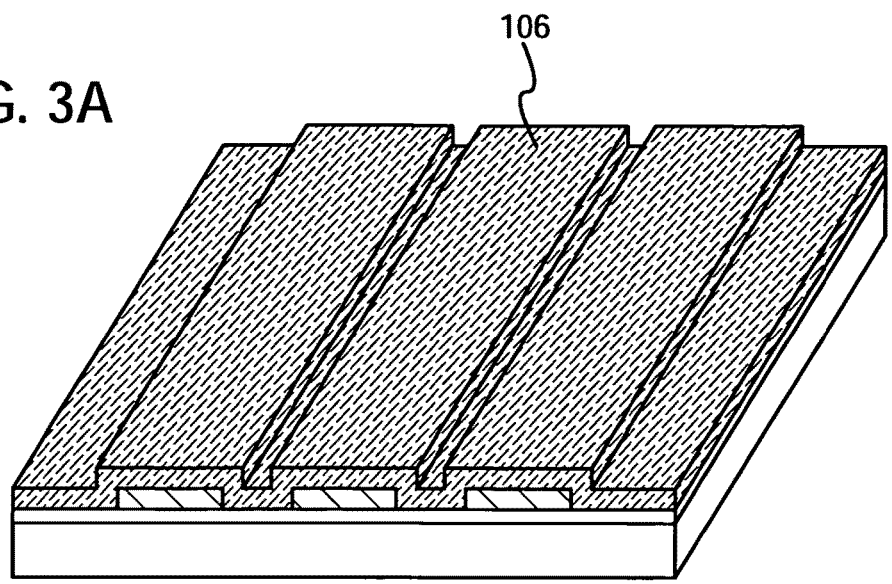
FIGS. 3A and 3B are diagrams illustrating a manufacturing process of a semiconductor device of the present invention.

Next, as shown in FIG. 3A, an amorphous semiconductor layer 106 which covers the surfaces of the second insulating layers 103 to 105 and the depression portion formed of the first insulating layer 101 and the second insulating layers 103 to 105 is formed. That is, the amorphous semiconductor layer 106 is formed so as to cover the projection portion and the depression portion formed by the first insulating layer 101 which is a base and the second insulating layers 103 to 105, as shown in the drawing. Note that the amorphous semiconductor layer 106 preferably has approximately the same thickness or a greater thickness than the depth of the depression portion formed by the first insulating layer 101 and the second insulating layers 103 to 105. The amorphous semiconductor layer 106 can be formed using silicon, a compound ($Si_xGe_{1-x}$) of silicon and germanium, a compound of silicon and carbon, or the like. For example, for the amorphous semiconductor layer 106, an amorphous silicon film with a thickness of 0.01 μm to 3 μm (preferably, 0.1 μm to 1 μm) can be used.

In order to eliminate an influence of chemical contamination by boron or the like which is attached to the surfaces of the first insulating layer 101 and the second insulating layers 103 to 105 and to prevent the insulating surfaces from coming into direct contact with the amorphous semiconductor layer, a silicon oxynitride film may be formed in succession as a third insulating layer (not shown) in the same film formation apparatus as that used for the amorphous semiconductor layer without exposure to air, just before the formation of the amorphous semiconductor layer 106. This third insulating layer is provided to eliminate the influence of the above-mentioned chemical contamination and to improve adhesion between the first insulating layer and second insulating layer and the amorphous semiconductor layer. Such an effect is sufficiently obtained even if a very thin layer is used. Typically, the third insulating layer may have a thickness of 5 nm to 50 nm (preferably, 20 nm or more in order to increase the blocking effect on chemical contamination).

Figure 3B:
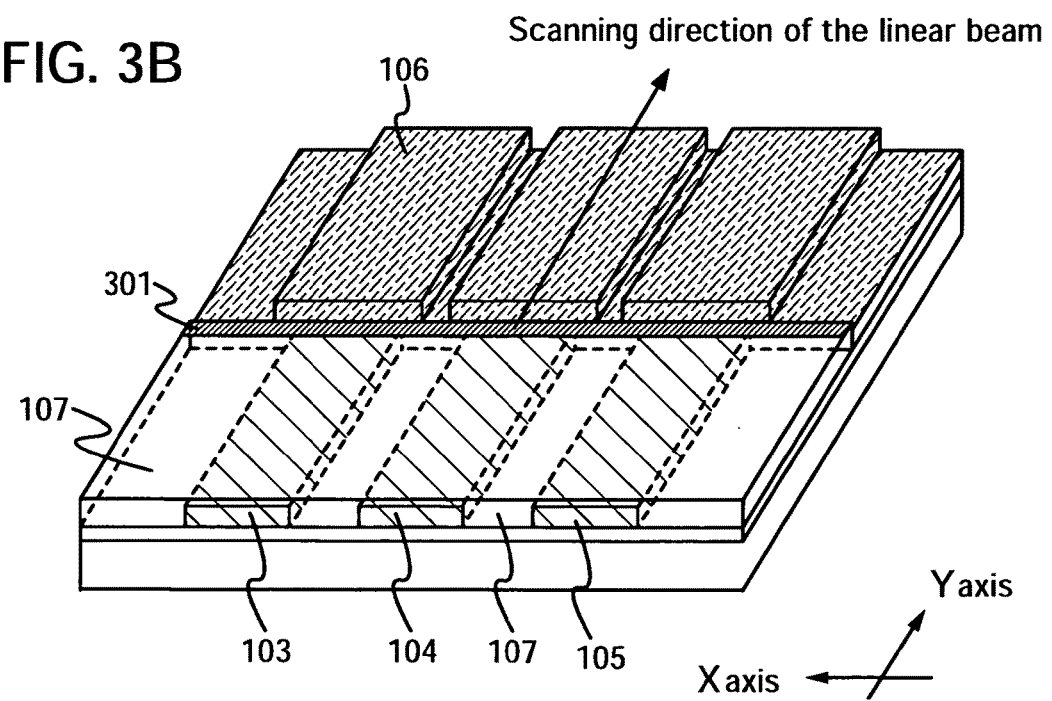

Next, as shown by an arrow in FIG. 3B, the amorphous semiconductor layer 106 is irradiated with a linear beam. By irradiation of the amorphous semiconductor layer 106 with a linear beam, a crystalline semiconductor layer 107 can be formed. Here, a region 301 denotes a region irradiated with a linear beam in FIG. 3B. The linear beam is set so that a direction (in the diagram, a X-axis direction) along the long length of a region 301 is crossed with a direction in which each of the second insulating layers 103 to 105 extends. The linear beam is scanned in a direction (in the diagram, a Y-axis direction) along the short length of the region 301. Note that the linear beam is a laser beam that irradiates a linear shape of a surface to be radiated. The phrase "linear shape" here does not strictly mean a "line" but means a rectangle having a large aspect ratio (e.g., an aspect ratio of 10 or more (preferably, 100 or more)). Note that a laser beam having a linear shape is used to provide sufficient energy density enough to achieve sufficient annealing for an irradiated body, and even a laser beam having a rectangular shape or an elliptical shape can be used as long as sufficient annealing can be performed with respect to an irradiated body.

In this embodiment mode, scanning of a linear beam is performed in a direction parallel to the direction in which a linear stripe pattern extends, and a melted amorphous semiconductor flows into the depression portion due to surface tension and is solidified. Accordingly, the crystalline semiconductor layer 107, the surface of which is approximately planarized as shown in FIG. 3B, is formed. Note that an interface between a vapor phase and the surface of the semiconductor layer that is melted and planarized exists in a state of equilibrium.

In forming the crystalline semiconductor layer by a laser crystallization method, a gas laser or a solid state laser can be used. The gas laser or the solid state layer may be a continuous wave laser or a pulsed laser. As a laser beam which can be used here, for example, a beam emitted from one or plural kinds of a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser, can be used. Irradiation of a laser beam of a fundamental wave of such lasers or a second to fourth harmonic of such a fundamental wave can give a crystal with a large grain size.

Note that a laser that uses, as a medium, single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser; and a Ti:sapphire laser, can continuously oscillate. Further, pulse oscillation thereof can be performed with a repetition rate of 10 MHz or more by performing Q switch operation or mode locking. When a continuous wave laser beam is oscillated or a laser beam is oscillated at a repetition rate of 10 MHz or more, the surface of the crystallized semiconductor layer can be planarized. Accordingly, a gate insulating layer to be formed later can be thinned, whereby a thinner semiconductor device can be fabricated. The formation of the crystallized semiconductor layer with a planar surface contributes to improvement of the withstand voltage of a gate insulating layer.

It is desirable that the wavelength of a continuous wave laser beam be 200 nm to 700 nm in consideration of an absorption coefficient of the amorphous semiconductor layer. Light of such a wavelength range can be obtained by removing the second harmonic and the third harmonic of a fundamental wave using a wavelength conversion element. For the wavelength conversion element, ADP (ammonium dihydrogen phosphate), $Ba_2NaNb_5O_{15}$ (barium sodium niobate), CdSe (cadmium selenide), KDP (potassium dihydrogen phosphate), $LiNbO_3$ (lithium niobate), Se, Te, LBO, BBO, KB5, or the like can be applied. In particular, it is desirable that LBO be used. In addition, it is preferable to emit the laser beam with oscillation of $TEM_{00}$ (a single lateral mode) because the uniformity of energy of a linear beam spot that is obtained in the surface to be irradiated can be increased. Note that in this embodiment mode, although the crystalline semiconductor layer is formed by scanning the amorphous semiconductor layer with a linear beam, a light-exposure method in which an object to be irradiated does not move at the time of irradiation with an electromagnetic wave of a laser or the like may be used. For example, a light-exposure method such as one-shot exposure or step exposure may be used.

Then, heat treatment at 500° C. to 600° C. is preferably performed to remove a distortion accumulated in the crystalline semiconductor layer. This distortion is generated by shrinkage in the volume of a semiconductor caused by crystallization, thermal stress with a base, lattice mismatch, or the like. This heat treatment may be performed using a general heat treatment apparatus, and treatment for 1 minute to 10 minutes may be performed by using, for example, a rapid thermal annealing (RTA) method of a gas heating method. In the case where an RTA method is employed, heat treatment at a higher temperature is possible. For example, heat treatment may be performed at approximately 500° C. to 700° C. Note that this step is not an essential requirement in the present invention and may be employed as appropriate.

Figure 4:
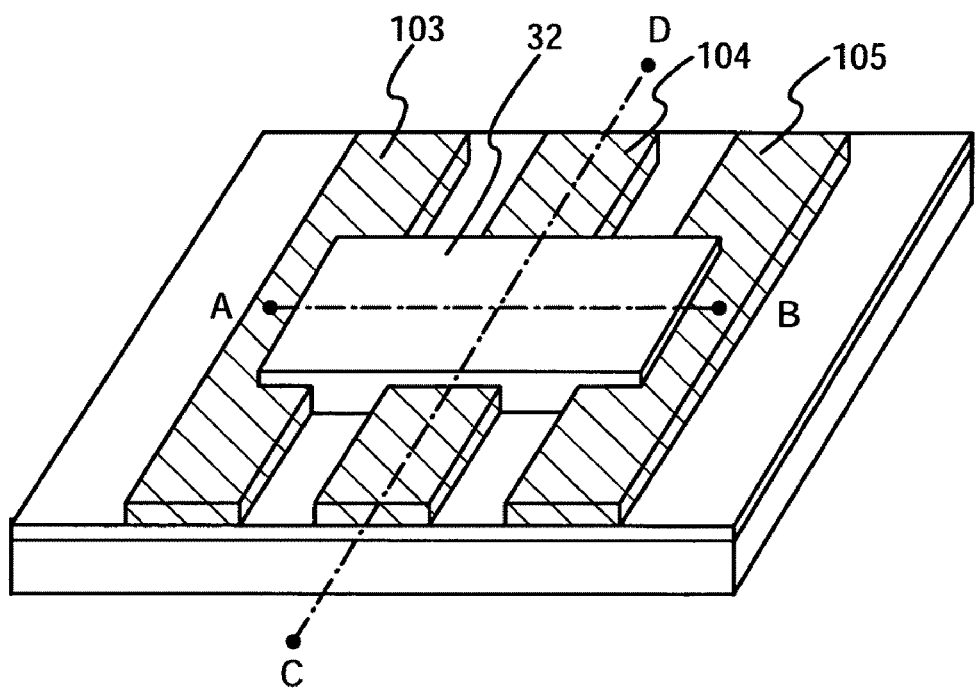
FIG. 4 is a diagram illustrating a manufacturing process of a semiconductor device of the present invention.

Then, the crystalline semiconductor layer 107 is dry etched, and the island-shaped semiconductor layer 32 of a thin film transistor is formed (FIG. 4). Note that as an etching gas for the dry etching, a fluorine-based gas such as $CF_4$, $NF_3$, $SF_6$, $CHF_3$, or $CF_4$, a mixed gas in which $O_2$ gas, $H_2$ gas, or an inert gas such as He and Ar is suitably added to such a fluorine-based gas, or the like can be used. Preferably, a mixed gas that contains $CF_4$ and $O_2$, a mixed gas that contains $SF_6$ and $O_2$, a mixed gas that contains $CHF_3$ and He, or a mixed gas that contains $CF_4$ and $H_2$ is used. In addition, etching is not limited to being performed by dry etching but may be performed by wet etching. In this case, the semiconductor layer 32 can be formed by wet etching of the crystalline semiconductor layer 107 using an alkaline solution containing an organic base typified by tetramethylammonium hydroxide (TMAH). Note that, in the case where a solution of TMAH or the like is used as an etchant, selective etching takes place with only the crystalline semiconductor layer 107. Therefore, etching can be conducted without damaging the insulating layer functioning as a base.

Through the above steps, an island-shaped semiconductor layer can be formed on an insulating surface having a projection portion. Note that in the present embodiment mode, the semiconductor layer formed over the projection portion has a thickness of 10 nm to 200 nm, preferably, approximately 10 nm to 50 nm, more preferably, approximately 10 nm to 30 nm. Note that the semiconductor layer with a thickness of 50 nm or less may be formed by thinning the semiconductor layer which has a thickness of 50 nm or more by dry etching. As an etching gas for the etching, a chlorine-based gas such as $Cl_2$, $BCl_3$, or $SiCl_4$; a fluorine-based gas such as $CF_4$, $NF_3$, $SF_6$, $CHF_3$, or $CF_4$; a mixed gas in which $O_2$ gas, $H_2$ gas, or an inert gas such as He or Ar, is added as appropriate to a fluorine-based gas; or the like can be used. Note that before the dry etching is performed, the semiconductor layer surface may be treated with dilute hydrofluoric acid to remove an oxide layer which is formed on the semiconductor layer surface by natural oxidation, and then the semiconductor layer surface may be treated with ozone water or the like to form an oxide layer on the semiconductor layer surface.

It is noted that, even when the amount of an impurity element with which a channel formation region is doped is increased in order to control the threshold voltage of a TFT, a TFT with a good subthreshold swing and a controlled threshold voltage can be manufactured because formation of the semiconductor layer over the projection portion at a thickness of approximately 50 nm or less facilitates the manufacture of a complete depletion type TFT.

Next, a process for manufacturing a TFT using the semiconductor layer 32 will be described with reference to FIGS. 5A to 5H. Note that FIGS. 5A to 5D each show a cross-sectional view taken along a dashed line connecting a point A and a point B of FIG. 4, and FIGS. 5E to 5H each show a cross-sectional view taken along a dashed line connecting a point C and a point D of FIG. 4.

Figure 5A:
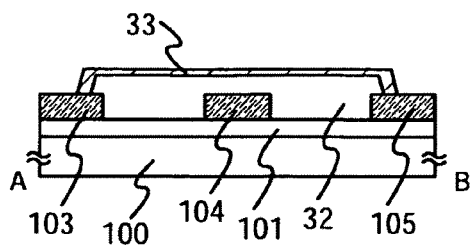
FIGS. 5A to 5H are diagrams illustrating a manufacturing process of a thin film transistor of the present invention.
Figure 5E:
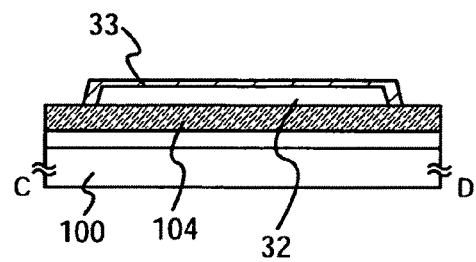

Subsequently, the gate insulating layer 33 is formed over the semiconductor layer 32 (FIGS. 5A and 5E). The gate insulating layer 33 can be formed of a single layer or stacked films using a silicon oxide (SiO) film, a silicon nitride (SiN) film, a silicon oxynitride ($SiO_xN_y$, where x>y>0) film, a silicon nitride oxide ($SiN_xO_y$, where x>y>0) film, an Hf-based oxide film, or the like. Such an insulating layer can be formed by a vapor phase growth method or a sputtering method. Note that plasma treatment may be performed on the surface of the gate insulating layer that is formed by vapor phase growth or a sputtering method.

Alternatively, a silicon oxide (SiO) film, a silicon nitride (SiN) film, a silicon oxynitride ($SiO_xN_y$, where x>y>0) film, or a silicon nitride oxide ($SiN_xO_y$, where x>y>0) film can be used as the gate insulating layer. These films are formed on the surface of the semiconductor layer by performing a plasma treatment on the surface of the semiconductor layer in an oxygen or nitrogen-containing atmosphere after the semiconductor layer 32 is formed.

Figure 5B:
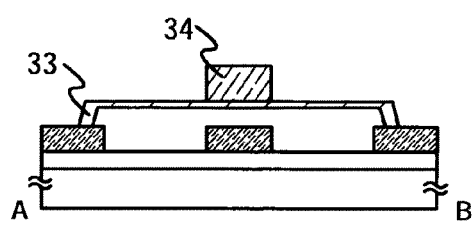
Figure 5F:
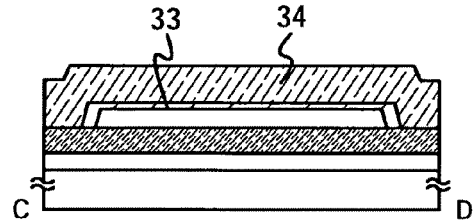

Next, the conductive layer 34 functioning as a gate electrode is formed over the gate insulating layer 33 (FIGS. 5B and 5F). Here, an example where the conductive layer 34 is formed as a single layer is shown; however, the conductive layer 34 may alternatively have a structure in which a conductive material is provided in a stack of layers containing two or three or more layers. Note that the conductive layer 34 can be formed by selectively etching a conductive layer which is formed so as to cover the gate insulating layer 33, although this process is not shown in the drawings. Note that the gate insulating layer 33 except for a portion under the gate electrode may be removed by etching.

The conductive layer 34 can be formed using an element such as tantalum (Ta), tungsten (W), titanium (Ti), molybdenum (Mo), aluminum (Al), copper (Cu), chromium (Cr), niobium (Nb), or the like, or using an alloy or a compound that contains any of such elements as its main component. Alternatively, the conductive layer 34 can be formed using a semiconductor material typified by polycrystalline silicon doped with an impurity element such as phosphorus. For example, in the case where the conductive layer 34 has a stacked-layer structure including a first conductive film and a second conductive film, tantalum nitride may be used as the first conductive film and tungsten may be used as the second conductive film. Note that the conductive layer 34 is not limited to this combination. When the conductive layer 34 is formed as a stacked layer, the conductive layer 34 can be provided by freely combining any of the materials described above.

Figure 5C:
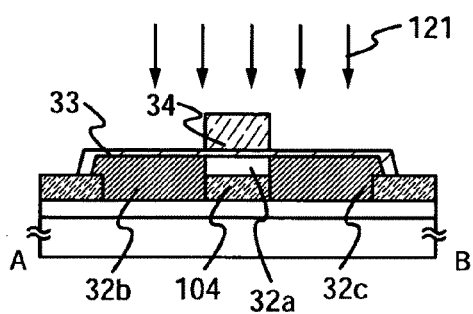
Figure 5G:
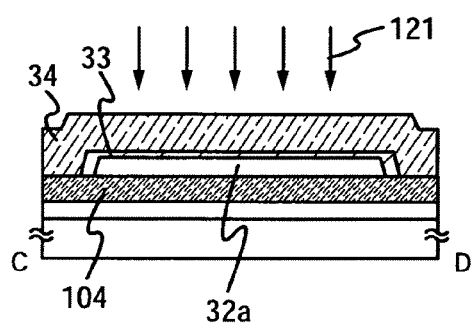

Subsequently, an impurity element 121 is introduced into the semiconductor layer 32 using the conductive layer 34 as a mask, which results in the impurity regions 32b and 32c and the channel formation region 32a into which the impurity element 121 is not introduced (FIGS. 5C and 5G). Note that here, because the impurity element is introduced after the conductive layer 34 is formed so as to go across the island-shaped semiconductor layer 32, the impurity regions 32b and 32c into which an impurity is introduced are formed in regions which are not covered by the conductive layer 34, and the channel formation region 32a into which the impurity element 121 is not introduced is formed in a region which is covered by the conductive layer 34.

Here, an impurity element imparting n-type conductivity or p-type conductivity can be used as the impurity element 121. As an impurity element imparting n-type conductivity, phosphorus (P), arsenic (As), or the like can be used. As an impurity element imparting p-type conductivity, boron (B), aluminum (Al), gallium (Ga), or the like can be used. For example, phosphorus (P) can be introduced as the impurity element 121 into the semiconductor layer 32 at a concentration of from $1 \times 10^{18}/cm^3$ to $1 \times 10^{21}/cm^3$ to form the impurity regions 32b and 32c which have n-type conductivity. Further, low-concentration impurity regions (also referred to as LDD regions), to which an impurity is added at a lower concentration than that of the source region and the drain region, may be formed between the channel formation region 32a and the source region and the drain region.

Further, an impurity element which imparts the same conductivity type as or the opposite conductivity type to the impurity added to the impurity regions 32b and 32c may be added into the channel formation region 32a. By adding an impurity which imparts the same conductivity type or the opposite conductivity type into the channel formation region 32a, the threshold voltage of a TFT can be controlled. Note that this impurity element may be added by doping via the gate electrode or may be added in advance before the gate electrode is formed.

Figure 5D:
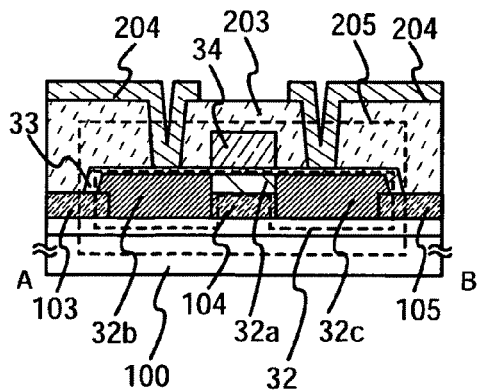
Figure 5H:
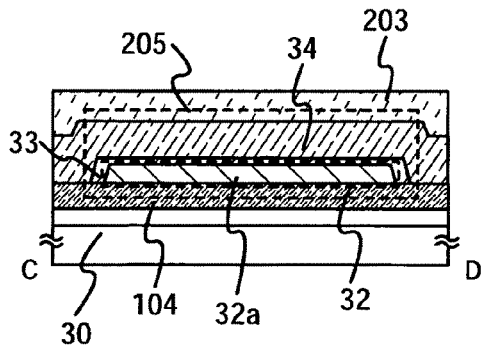

Then, the insulating layer 203 is formed so as to cover the conductive layer 34, the gate insulating layer 33, the insulating layers 103 to 105, and the like (FIGS. 5D and 5H). Subsequently, contact holes are formed in the gate insulating layer 33 and the insulating layer 203, and the conductive layer 204 which functions as a source electrode or a drain electrode are selectively formed over the insulating layer 203 (FIGS. 5D and 5H). Here, the conductive layer 204 is provided so as to be electrically connected to the impurity regions 32b and 32c which each function as a source region or a drain region of the semiconductor layer 32.

Here, as the insulating layer 203, a silicon oxide film, a silicon oxynitride ($SiO_xN_y$, where x>y>0) film, a silicon nitride oxide ($SiN_xO_y$, where x>y>0) film, or the like, which is formed by a CVD method, a sputtering method, or the like, can be used. Alternatively, the insulating layer 203 can be a single layer or a stacked-layer structure of a film which includes an organic material such as polyimide, polyamide, poly(vinyl phenol), benzocyclobutene-based polymer, acrylic polymer, epoxy-based polymer, or the like; a siloxane material such as a siloxane resin; an oxazole resin; or the like. Note that a siloxane material corresponds to a material that includes a Si—O—Si bond. Siloxane is a material having a skeletal structure formed of bonds between silicon (Si) and oxygen (O). As a substituent, an organic group that contains at least hydrogen (e.g., an alkyl group or an aromatic hydrocarbon) can be used. Alternatively, a fluoro group can be used as the substituent. An oxazole resin is, for example, photosensitive polybenzoxazole or the like. Photosensitive polybenzoxazole is a material which has a low dielectric constant (a dielectric constant of 2.9 at 1 MHz at room temperature), high heat resistance (according to results of thermogravimetry-differential thermal analysis (TG/DTA) under the condition of a rate of temperature increase of 5° C./min, it has a thermal decomposition temperature of 550° C.), and a low water absorption rate (0.3% at room temperature over 24 hours). Compared to a relative dielectric constant (approximately 3.2 to 3.4) of polyimide or the like, an oxazole resin has a lower dielectric constant (approximately 2.9). Therefore, when an oxazole resin is used, generation of parasitic capacitance can be suppressed, and high-speed operation of a TFT is possible. Here, a single layer or a stack of a film including silicon oxide, silicon oxynitride ($SiO_xN_y$, where x>y>0), or silicon nitride oxide ($SiN_xO_y$, where x>y>0), which is formed by a CVD method is provided as the insulating layer 203. Alternatively, the insulating layer 203 may be formed as a stack of films including an organic material such as polyimide, polyamide, poly(vinyl phenol), benzocyclobutene-based polymer, acrylic polymer, or epoxy-based polymer; a siloxane material such as a siloxane resin or the like; or an oxazole resin.

As the conductive layer 204, a single-layer structure or a stacked-layer structure using a film formed from one of the elements selected from aluminum, tungsten, titanium, tantalum, molybdenum, nickel, and neodymium or from an alloy that contains a plurality of those elements can be used. For example, as the conductive film formed from an alloy that contains a plurality of the elements, an aluminum alloy that contains titanium, an aluminum alloy that contains neodymium, or the like can be used. Further, in the case where the conductive layer 204 is provided as a stacked-layer structure, a structure in which an aluminum layer or an aluminum alloy layer such as that described above is interposed between titanium layers may be employed, for example.

Through the above-described steps, a semiconductor device including the thin film transistor 205 can be manufactured.

In the semiconductor device given in this embodiment mode, the semiconductor layer that is formed on the insulating surface having a projection portion and a depression portion which are formed by the first insulating layer 101 and the second insulating layers 103 to 105 is melted and planarized so that a semiconductor layer having a channel formation region with a thickness that is smaller than the thickness of the source region or the drain region is formed. This feature provides an advantage to the recovery of crystallinity in the heat treatment which is conducted for thermal activation of an impurity element after the addition of the impurity element by an ion doping method or the like. Furthermore, an increase in resistance of the source region or the drain region can be suppressed. Subthreshold swing can be lowered, and a decrease in the on-state current can be suppressed because the thickness of the channel formation region is small compared with thickness of the source region or the drain region. Since the planarization of the semiconductor layer is carried out by melting the semiconductor layer, a semiconductor device can be manufactured readily without increasing the number of processes. Accordingly, a highly responsive semiconductor device in which subthreshold swing is low and a decrease in the on-state current is suppressed can be manufactured.

Note that the form of the thin film transistor is not limited to that shown in FIGS. 1A to 1C. For example, a sidewall 206 formed from an insulator may be formed, such that it is in contact with a side surface of the conductive layer 34 which functions as a gate electrode. Further, low-concentration impurity regions (also referred to as LDD regions) 32d and 32e, to which an impurity is added at a lower concentration than that of the impurity regions 32b and 32c, may be formed between the impurity regions 32b and 32c, which each function as a source region or a drain region, and the channel formation region 32a (FIG. 6A). Further, the structure of the thin film transistor is not limited to that described above. A single-gate structure in which one channel formation region is formed, a double-gate structure in which two channel formation regions are formed, or a multi-gate structure such as a triple-gate structure in which three channel formation regions are formed can be used. Further, the gate electrode may have a stacked-layer structure. For example, a structure may be employed in which the gate electrode has a two-layer structure including a first conductive layer 34a and a second conductive layer 34b that is formed over the first conductive layer 34a; the first conductive layer is formed with a tapered shape; and the low-concentration impurity regions 32d and 32e are provided such that they overlap only with the first conductive layer (FIG. 6B). Further, a structure may be employed in which the gate electrode includes the first conductive layer 34a and the second conductive layer 34b that is formed over the first conductive layer 34a, and the sidewall 206 is provided, such that it is in contact with a side surface of the second conductive layer 34b and is formed over the first conductive layer 34a (FIG. 6C). Further, the impurity regions 32b and 32c which each function as a source region or a drain region can be formed from a silicide of Ni, Co, W, or the like.

Embodiment Mode 2

In this embodiment mode, a method for manufacturing a semiconductor device of the present invention which includes a thin film transistor, a memory element, and an antenna will be described with reference to the drawings.

Figure 7A:
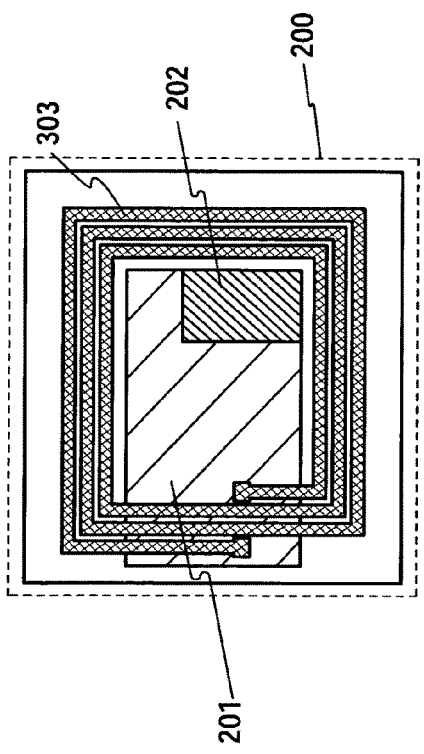
FIG. 7A is a top view and FIG. 7B is a cross-sectional view illustrating a structure of a semiconductor device of the present invention.
Figure 7B:
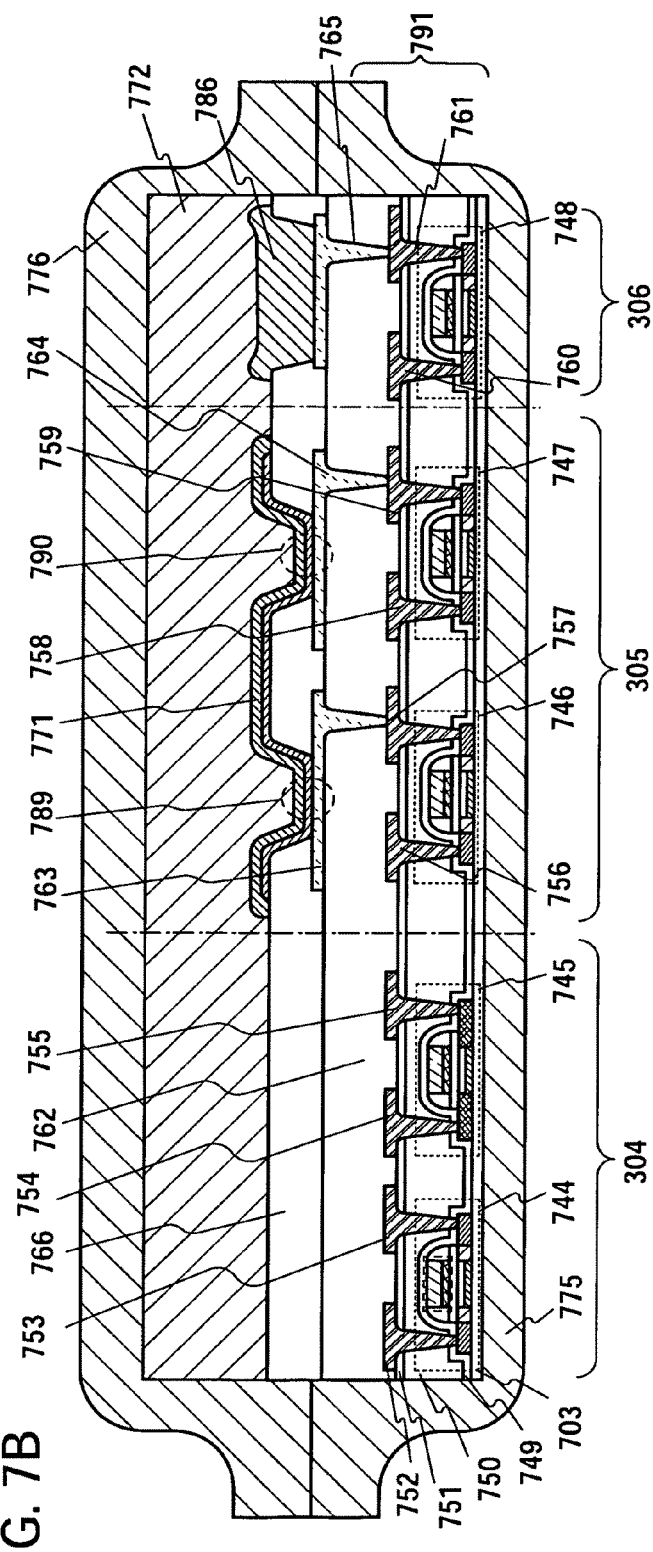

FIGS. 7A and 7B show a top view and a cross-sectional view, respectively, each illustrating a structure of a semiconductor device given in this embodiment mode. Note that an example of an upper surface structure of a semiconductor device given in this embodiment mode is shown in FIG. 7A, and a part of a cross-sectional structure of FIG. 7A is shown in FIG. 7B.

In this embodiment mode, a semiconductor device 200 includes an integrated circuit portion 201, a memory portion 202, and an antenna 303 (FIG. 7A). Note that, in FIG. 7B, a region 304 corresponds to a part of a cross-sectional structure of the integrated circuit portion 201 of FIG. 7A, a region 305 corresponds to a part of a cross-sectional structure of the memory portion 202 of FIG. 7A, and a region 306 corresponds to a part of a cross-sectional structure of the antenna 303 of FIG. 7A.

As shown in FIG. 7B, the semiconductor device of this embodiment mode includes thin film transistors 744 to 748 (TFTs) which are provided over a first base 775 with an insulating layer 703 interposed therebetween, an insulating layer 750 provided over the thin film transistors 744 to 748, and conductive layers 752 to 761 each functioning as a source electrode or a drain electrode provided over the insulating layer 750. The semiconductor device of this embodiment mode further includes an insulating layer 751 provided over the insulating layer 750; an insulating layer 762 provided over the insulating layer 751 and the conductive layers 752 to 761; conductive layers 763 to 765 provided over the insulating layer 762; an insulating layer 766 provided so as to cover a part of each of the insulating layer 762 and the conductive layers 763 to 765; memory elements 789 and 790 provided over the conductive layers 763 and 764, respectively; a conductive layer 786 that functions as an antenna provided over the conductive layer 765; an insulating layer 772 provided so as to cover the insulating layer 766, a conductive layer 771 included in the memory elements and the conductive layer 786 that functions as an antenna; and a second base 776 provided over the insulating layer 772. Note that the integrated circuit portion 201, the memory portion 202, and the antenna 303 of the semiconductor device are sealed with the first base 775 and the second base 776.

Next, an example of a manufacturing process of the semiconductor device shown in FIGS. 7A and 7B will be described with reference to FIGS. 8A to 8C, FIGS. 9A and 9B, FIGS. 10A and 10B, and FIGS. 11A and 11B.

Figure 8A:
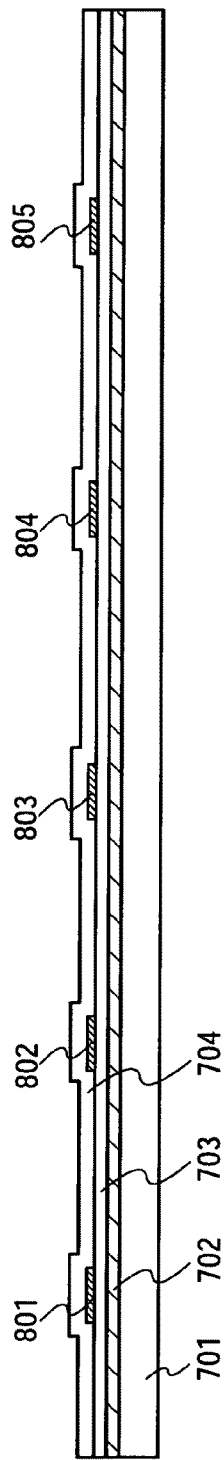
FIGS. 8A to 8C are cross-sectional views illustrating a manufacturing process of a semiconductor device of the present invention.

First, a release layer 702 is formed on a surface of a substrate 701 (FIG. 8A). The substrate 701 may be a glass substrate, a quartz substrate, a substrate in which an insulating layer is formed on a surface of a metal substrate or a stainless-steel substrate, or a plastic substrate which can withstand the treatment temperature of the manufacturing process. In the case of using such a substrate 701, there are no particular restrictions on the area or the shape thereof; therefore, for example, by using a rectangular substrate with a length of at least one meter on a side, the productivity can be dramatically improved. This merit is greatly advantageous as compared to the case of using a circular silicon substrate. In addition, the release layer 702 is formed over an entire surface of the substrate 701 in this process; however, the release layer may be selectively provided if necessary by using a photolithography method after a layer to serve as the release layer is formed over the entire surface of the substrate 701. Note that the release layer 702 is formed so as to be in contact with the substrate 701; however, if necessary, an insulating layer may be formed between the substrate 701 and the release layer 702.

The release layer 702 is formed in a single layer or a stack with a layer using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), or silicon (Si), an alloy or a compound that contains the above-described element as its main component by a sputtering method, a plasma CVD method, or the like. The layer that contains silicon may have any structure of amorphous, microcrystal, or polycrystalline structure.

In the case where the release layer 702 has a single-layer structure, a layer that contains tungsten, a layer that contains molybdenum, or a layer that contains a mixture of tungsten and molybdenum may be formed, for example. Alternatively, a layer that contains oxide or oxynitride of tungsten, a layer that contains oxide or oxynitride of molybdenum, or a layer that contains oxide or oxynitride of a mixture of tungsten and molybdenum may be formed. Note that a mixture of tungsten and molybdenum is an alloy of tungsten and molybdenum, for example. Further, oxide of tungsten can be referred to as tungsten oxide.

In the case where the release layer 702 has a stacked-layer structure, a layer that contains tungsten, a layer that contains molybdenum, or a layer that contains a mixture of tungsten and molybdenum may be formed as a first layer. A layer that contains oxide, nitride, oxynitride, or nitride oxide of tungsten, a layer that contains oxide, nitride, oxynitride, or nitride oxide of molybdenum, or a layer that contains oxide, nitride, oxynitride, or nitride oxide of a mixture of tungsten and molybdenum may be formed as a second layer.

When a stacked-layer structure of a layer that contains tungsten and a layer that contains oxide of tungsten is formed as the release layer 702, the layer that contains tungsten is formed and a layer that contains silicon oxide may be formed thereover so that a layer that contains oxide of tungsten is formed at the interface between the layer that contains tungsten and the layer that contains silicon oxide. This structure is also applicable to the case where a stacked-layer structure of a layer that contains tungsten and a layer that contains nitride, oxynitride or nitride oxide of tungsten is formed. In this case, after a layer that contains tungsten is formed, a layer that contains silicon nitride, a layer that contains silicon oxynitride, or a layer that contains silicon nitride oxide may be formed thereover. The oxide of tungsten is denoted by $WO_x$, and X is in the range of 2 to 3. X can be 2 ($WO_2$), 2.5 ($W_2O_5$), 2.75 ($W_4O_{11}$), 3 ($WO_3$), and the like. In forming a layer that contains oxide of tungsten, there is no particular limitation on the value of X, and oxide to be formed can be determined based on an etching rate or the like. In order to obtain the most preferable etching rate, it is preferable to use the layer which contains oxide of tungsten ($WO_x$, where $0<X<3$) formed by a sputtering method in an oxygen atmosphere. Therefore, in order to reduce the time for manufacture, the release layer may preferably be formed using a layer that contains oxide of tungsten which is formed by a sputtering method in an oxygen atmosphere. Alternatively, in the case of providing the release layer 702 having a stacked-layer structure of a metal layer and a layer that contains metal oxide, the release layer may be formed by forming the metal layer and then treating the metal layer with plasma treatment to form a metal oxide film as a layer that contains metal oxide on the metal layer. A metal oxide film, a metal oxynitride film, or the like can be formed as a layer that contains metal oxide on the metal layer by performing plasma treatment in an oxygen atmosphere, a nitrogen atmosphere, or an $N_2O$ atmosphere.

Next, the insulating layer 703 to be a base is formed to cover the release layer 702. The insulating layer 703 is formed by a layer that contains oxide of silicon or nitride of silicon in a single layer or a stack with a layer that contains oxide of silicon or nitride of silicon by a sputtering method, a plasma CVD method, or the like. Oxide of silicon is a material that contains silicon (Si) and oxygen (O) such as silicon oxide, silicon oxynitride, or silicon nitride oxide. Nitride of silicon is a material that contains silicon (Si) and nitrogen (N) such as silicon nitride, silicon oxynitride, or silicon nitride oxide. In the case where the insulating layer to be the base has a two-layer structure, a silicon nitride oxide layer may be formed as a first layer, and a silicon oxynitride layer may be formed as a second layer, for example. In the case where the insulating layer to be a base has a three-layer structure, a silicon oxide layer, a silicon nitride oxide layer, and a silicon oxynitride layer may be formed as a first insulating layer, a second insulating layer, and a third insulating layer respectively. Alternatively, a silicon oxynitride layer, a silicon nitride oxide layer, and a silicon oxynitride layer may be formed as a first insulating layer, a second insulating layer, and a third insulating layer respectively. The insulating layer to be the base functions as a blocking film for preventing impurities entering from the substrate 701.

Next, insulating layers 801 to 805 are formed over the insulating layer 703. Note that the insulating layers 801 to 805 are formed so as to be arranged at a position corresponding to channel formation regions of the thin film transistors 744 to 748 to be formed later.

Figure 8B:
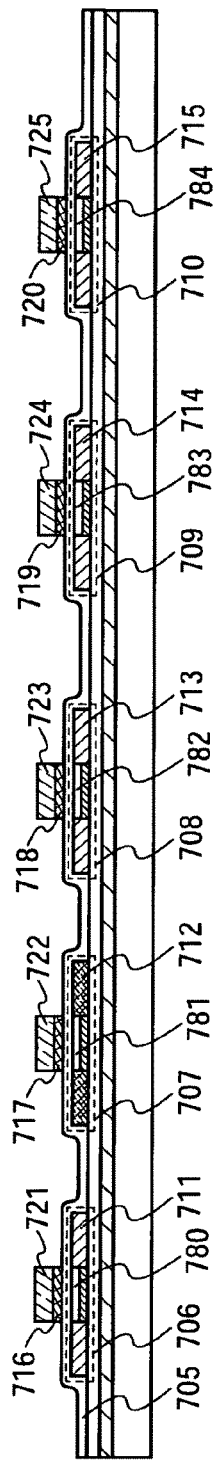

Subsequently, an amorphous semiconductor layer 704 (for example, a layer that contains amorphous silicon) is formed over the insulating layer 703 and the insulating layers 801 to 805. Then, a crystalline semiconductor layer obtained by crystallizing the amorphous semiconductor layer 704 by using a method similar to that in Embodiment Mode 1 is etched into a desired shape, whereby crystalline semiconductor layers 706 to 710 are formed (FIG. 8B).

Then, a gate insulating layer 705 is formed to cover the crystalline semiconductor layers 706 to 710. The gate insulating layer 705 is formed of a single layer or a stack of a layer that contains oxide of silicon or nitride of silicon by a plasma CVD method or a sputtering method. Specifically, a layer that contains silicon oxide, a layer that contains silicon oxynitride, or a layer that contains silicon nitride oxide is formed in a single layer or a stack.

Subsequently, a first conductive layer and a second conductive layer are stacked on the gate insulating layer 705. The first conductive layer is formed at a thickness of 20 nm to 100 nm by a plasma CVD method or a sputtering method. The second conductive layer is formed at a thickness of 100 nm to 400 nm. The first conductive layer and the second conductive layer are formed by using an element such as tantalum (Ta), tungsten (W), titanium (Ti), molybdenum (Mo), aluminum (Al), copper (Cu), chromium (Cr), niobium (Nb), or the like or an alloy or a compound that contains the above-described element as its main component. Alternatively, a semiconductor material, typically, polycrystalline silicon doped with an impurity element such as phosphorus, may be used. As an example of a combination of the first conductive layer and the second conductive layer, a tantalum nitride layer and a tungsten layer, a tungsten nitride layer and a tungsten layer, a molybdenum nitride layer and a molybdenum layer, or the like can be used. Since tungsten and tantalum nitride have high heat resistance, heat treatment for thermal activation of an impurity element can be performed after the first conductive layer and the second conductive layer are formed of the given material. Alternatively, in the case where a three-layer structure is employed instead of a two-layer structure, a stacked-layer structure of a molybdenum layer, an aluminum layer, and a molybdenum layer may be employed.

Then, a resist mask is formed by a photolithography method and etching treatment for forming a gate electrode and a gate line is performed, whereby conductive layers 716 to 725 (also referred to as gate electrode layers) functioning as gate electrodes are formed.

Next, another resist mask is formed by a photolithography method. Then, an impurity element imparting n-type conductivity is added into the crystalline semiconductor layers 706, and 708 to 710 at low concentration by an ion doping method or an ion implantation method to form n-type impurity regions 711, and 713 to 715 and channel formation regions 780, and 782 to 784. An element belonging to group 15 of the Periodic Table may be used for the impurity element imparting n-type conductivity. For example, phosphorus (P) or arsenic (As) is used.

Next, another resist mask is formed by a photolithography method. Then, an impurity element imparting p-type conductivity is added into the crystalline semiconductor layer 707 to form a p-type impurity region 712 and a channel formation region 781. For example, boron (B) is used for the impurity element imparting p-type conductivity.

Figure 8C:
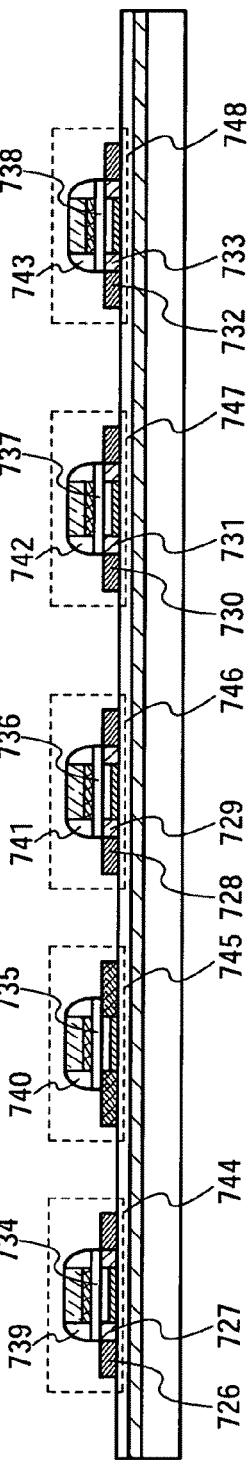

Next, an insulating layer is formed so as to cover the gate insulating layer 705 and the conductive layers 716 to 725. The insulating layer is formed of a single layer or a stack of a layer that contains an inorganic material such as silicon, oxide of silicon, or nitride of silicon or a layer that contains an organic material such as an organic resin by a plasma CVD method or a sputtering method. Then, the insulating layer is selectively etched by anisotropic etching mainly in the perpendicular direction with respect to the surface of the substrate, whereby insulating layers 739 to 743 (also referred to as sidewalls) in contact with the side surfaces of the conductive layers 716 to 725 are formed (FIG. 8C). Concurrently with the formation of the insulating layers 739 to 743, insulating layers 734 to 738 are formed by etching the insulating layer 705. The insulating layers 739 to 743 are used as masks for subsequent doping in the formation of an LDD (lightly doped drain) region.

Then, using the mask formed of a resist using a photolithography method and the insulating layers 739 to 743 as masks, an impurity element imparting n-type conductivity is added into the crystalline semiconductor layers 706, and 708 to 710 so that first n-type impurity regions 727, 729, 731, and 733 (also referred to as LDD regions) and second n-type impurity regions 726, 728, 730, and 732 (also referred to as source and drain regions) are formed. The concentration of the impurity element in the first n-type impurity regions 727, 729, 731, and 733 is lower than the concentration of the impurity element in the second n-type impurity regions 726, 728, 730, and 732. Through the above-described steps, formation of the n-type thin film transistors 744, and 746 to 748 and the p-type thin film transistor 745 is completed.

Note that to form the LDD region, the method in which a sidewall insulating layer is used as a mask facilitates to control the width of the LDD region, and the LDD region can be formed without fail.

Then, an insulating layer is formed in a single layer or a stack so as to cover the thin film transistors 744 to 748 (FIG. 9A). The insulating layer covering the thin film transistors 744 to 748 is formed of a single layer or a stack using an inorganic material such as oxide of silicon or nitride of silicon, an organic material such as polyimide, polyamide, benzocyclobutene-based polymer, acrylic polymer, epoxy-based polymer, and siloxane polymer, or the like by an SOG method, a droplet discharge method, or the like. For example, in the case where the insulating layer covering the thin film transistors 744 to 748 has a three-layer structure, a layer that contains silicon oxide may be formed as a first insulating layer 749, preferably, a layer that contains a resin may be formed as the second insulating layer 750, and a layer that contains silicon nitride may be formed as the third insulating layer 751.

Note that before the insulating layers 749 to 751 are formed or after one or more of thin layers of the insulating layers 749 to 751 are formed, heat treatment for recovering the crystallinity of the semiconductor layer, for activating the impurity element which has been added into the semiconductor layer, or for hydrogenating the semiconductor layer is preferably performed. For the heat treatment, a thermal annealing method, a laser annealing method, an RTA method, or the like is preferably used.

Then, the insulating layers 749 to 751 are etched by using a photolithography method to form contact holes so that the second n-type impurity regions 726, 728, 730 and 732 and the p-type impurity region 712 are exposed. Subsequently, a conductive layer is formed so as to fill the contact holes and patterned to form the conductive layers 752 to 761 each functioning as a source electrode or a drain electrode.

The conductive layers 752 to 761 are formed of a single layer or a stack using an element such as titanium (Ti), aluminum (Al), or neodymium (Nd); an alloy or a compound that contains the above-described element as its main component by a plasma CVD method or a sputtering method. An alloy that contains aluminum as its main component is an alloy that contains nickel whose main component is aluminum or an alloy that contains nickel and one or both of carbon and silicon whose main component is aluminum, for example. Each of the conductive layers 752 to 761 preferably uses, for example, a stacked-layer structure of a barrier layer, an aluminum-silicon (Al—Si) layer, and a barrier layer, or a stacked-layer structure of a barrier layer, an aluminum-silicon (Al—Si) layer, a titanium nitride layer, and a barrier layer. Note that a barrier layer corresponds to a thin layer formed using titanium, nitride of titanium, molybdenum, or nitride of molybdenum. Aluminum and aluminum silicon have low resistance and are inexpensive, and are therefore suitable for forming the conductive layers 752 to 761. In addition, generation of a hillock of aluminum or aluminum silicon can be prevented when barrier layers are provided as upper and lower layers of a stacked-layer structure. Further, the use of barrier layer containing titanium allows sufficient contact between the crystalline semiconductor layers and the conductive layers even if a thin layer is formed by the natural oxidation of the crystalline semiconductor layer. This is because highly reducible titanium readily reduces the naturally formed oxide layer on the semiconductor layer.

Next, the insulating layer 762 is formed so as to cover the conductive layers 752 to 761 (FIG. 9B). The insulating layer 762 is formed of a single layer or a stack using an inorganic material or an organic material by an SOG method, a droplet discharge method, or the like. The insulating layer 762 is preferably formed at a thickness of 0.75 µm to 3 µm.

Subsequently, the insulating layer 762 is etched by using a photolithography method to form contact holes in which the conductive layers 757, 759, and 761 are exposed. Then, a conductive layer is formed so as to fill the contact holes. The conductive layer is formed by a plasma CVD method or a sputtering method using a conductive material. Next, the conductive layer is patterned to form the conductive layers 763 to 765. Note that each of the conductive layers 763 and 764 corresponds to one of a pair of conductive layers included in a memory element. Therefore, the conductive layers 763 to 765 are preferably formed of a single layer or a stack using titanium, an alloy or a compound that contains titanium as its main component. Titanium has low resistance and enables size reduction of the memory element, whereby high integration can be realized. In addition, in an etching process for forming the conductive layers 763 to 765, it is preferable to perform wet etching in order to prevent damage to the thin film transistors 744 to 748 that exist in lower layers; hydrofluoric acid (HF) or an aqueous solution of ammonia and hydrogen peroxide is preferably used as the etchant.

Then, the insulating layer 766 is formed so as to cover the conductive layers 763 to 765. The insulating layer 766 is formed of a single layer or a stack using an inorganic material or an organic material by an SOG method, a droplet discharge method, or the like. In addition, the insulating layer 766 is preferably formed at a thickness of 0.75 µm to 3 µm. The insulating layer 766 is then etched by using a photolithography method to form contact holes 767 to 769 in which the conductive layers 763 to 765 are respectively exposed.

Figure 10A:
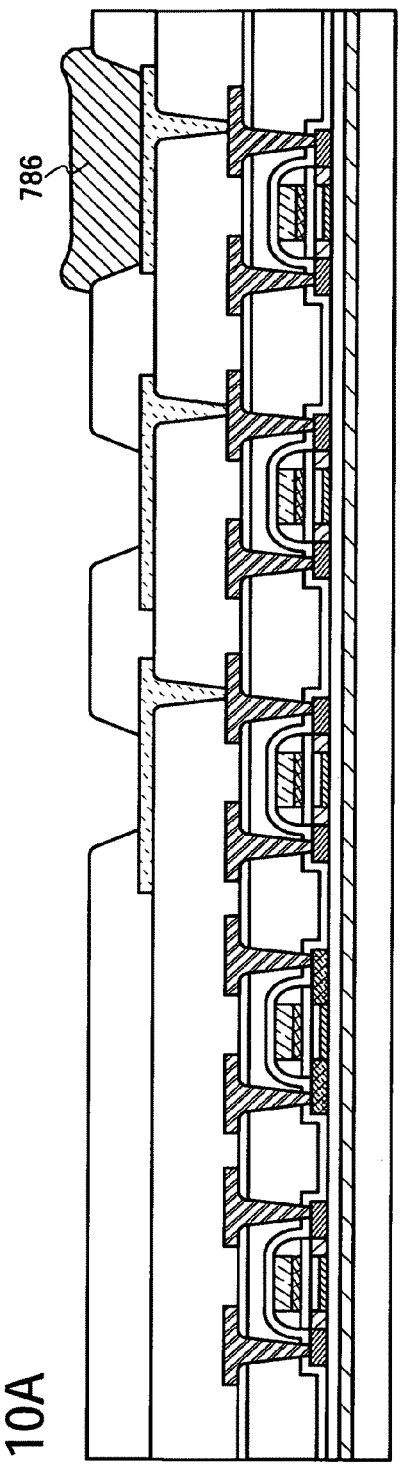
FIGS. 10A and 10B are cross-sectional views illustrating a manufacturing process of a semiconductor device of the present invention.

Subsequently, the conductive layer 786 that functions as an antenna is formed so as to be in contact with the conductive layer 765 (FIG. 10A). The conductive layer 786 is formed by a plasma CVD method, a sputtering method, a printing method, a droplet discharge method, or the like using a conductive material. Preferably, the conductive layer 786 is formed of a single layer or a stack using an element such as aluminum (Al), titanium (Ti), silver (Ag), or copper (Cu) or an alloy or a compound that contains the above-described element as its main component. Specifically, the conductive layer 786 is formed in such a way that a film is formed by a screen printing method using a paste that contains silver, and heat treatment is performed thereafter at 50° C. to 350° C. Alternatively, an aluminum layer is formed by a sputtering method and patterned to form the conductive layer 786. The patterning of the aluminum layer is preferably performed by wet etching, and heat treatment at 200° C. to 300° C. is preferably conducted after the wet etching.

Figure 10B:
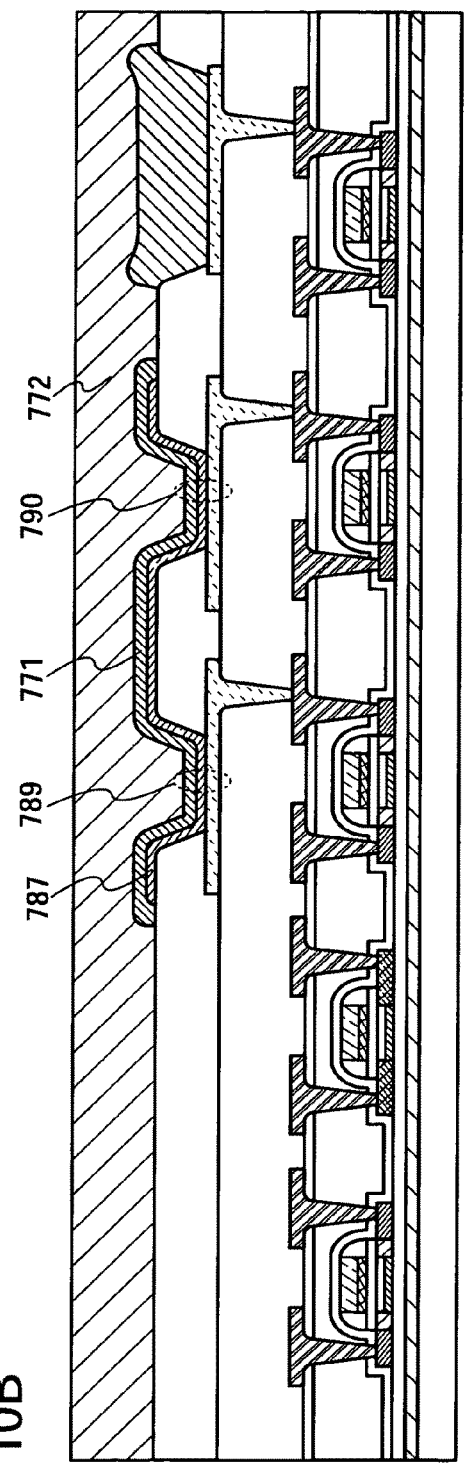

Next, an organic compound layer 787 is formed so as to be in contact with the conductive layers 763 and 764 (FIG. 10B). The organic compound layer 787 is formed by an evaporation method, a droplet discharge method, a spin coating method, a screen printing method, or the like. Subsequently, the conductive layer 771 is formed in contact with the organic compound layer 787. The conductive layer 771 is formed by a sputtering method, an evaporation method, or the like.

Through the above-described steps, the memory element 789 which includes the conductive layer 763, the organic compound layer 787, and the conductive layer 771, and the memory element 790 which includes the conductive layer 764, the organic compound layer 787, and the conductive layer 771 are fabricated.

Note that according to the manufacturing steps described above, the step for forming the organic compound layer 787 is carried out after the step for forming the conductive layer 786 that functions as an antenna because the heat resistance of the organic compound layer 787 is not high.

Subsequently, the insulating layer 772 functioning as a protective film is formed by an SOG method, a droplet discharge method, or the like so as to cover the memory elements 789 and 790 and the conductive layer 786 that functions as an antenna. The insulating layer 772 is formed using a layer that contains carbon such as DLC (diamond-like carbon), a layer that contains silicon nitride, a layer that contains silicon nitride oxide, a layer formed of an organic material, or, preferably, a layer formed of an epoxy resin.

Next, a thin film integrated circuit 791 is separated from the substrate 701. Here, after openings 773 and 774 are formed by irradiation with laser beams (for example, a laser beam having a wavelength in a UV region) (FIG. 11A), the thin film integrated circuit 791 can be separated from the substrate 701 using physical force. Alternatively, after the openings 773 and 774 are formed, an etchant may be introduced into the openings 773 and 774 to remove the release layer 702 before separating the thin film integrated circuit 791 from the substrate 701 (FIG. 11B). As the etchant, a gas or a liquid containing halogen fluoride or a halogen compound is used; for example, chlorine trifluoride ($ClF_3$) is used as a gas that contains halogen fluoride. When the release layer 702 is removed using this etching process, the thin film integrated circuit 791 is separated from the substrate 701. Part of the release layer 702 may be left remaining without being entirely removed, which allows the reduction of the consumption of the etchant and the processing time required for removing the release layer. Further, the thin film integrated circuit 791 can be retained over the substrate 701 even after the removal process of the release layer 702 if a part of the release layer 702 is left.

It is preferable to reuse the substrate 701 after the thin film integrated circuit 791 is separated in order to reduce manufacturing costs. In addition, the insulating layer 772 is formed to prevent the thin film integrated circuit 791 from shattering after the release layer 702 is removed. The thin film integrated circuit 791 which is small, thin, and light easily shatters after the release layer 702 is removed since it is not attached firmly to the substrate 701. However, the formation of the insulating layer 772 on the thin film integrated circuit 791 adds the weight of the insulating layer 772 to the thin film integrated circuit 791, and hence, release from the substrate 701 can be prevented. In addition, the formation of the insulating layer 772 secures the strength of the thin, and light thin film integrated circuit 791, which allows prevention of rolling of the thin film integrated circuit 791 after separation from the substrate 701.

Subsequently, one surface of the thin film integrated circuit 791 is attached to the second base 776, and the thin film integrated circuit 791 is completely separated from the substrate 701. Then, the first base 775 is provided on the other surface of the thin film integrated circuit 791, and one or both of heat treatment and pressure treatment are performed to seal the thin film integrated circuit 791 with the first base 775 and the second base 776. Accordingly, the semiconductor device shown in FIG. 7B can be fabricated. The first base 775 and the second base 776 may each be a film formed of polypropylene, polyester, polyvinylfluoride, polyvinylchloride, or the like, paper of a fibrous material, a film stack of a base film (polyester, polyamide, an inorganic vapor deposition film, paper, or the like) and an adhesive synthetic resin film (an acrylic-based synthetic resin, an epoxy-based synthetic resin, or the like), or the like. The film is bonded to a subject (i.e., the thin film integrated circuit 791) by thermocompression bonding. In the case where both the heat treatment and pressure treatment are carried out, an adhesive layer which is provided on the outermost surface of the film or a layer (not an adhesive layer) which is provided on the outermost layer of the film is melted by heat treatment and then is pressurized so that the film is attached to the subject. An adhesive layer may be provided on a surface of the first base 775 or the second base 776 but not necessarily be provided. The adhesive layer is a layer that contains an adhesive such as a heat curable resin, an ultraviolet-curable resin, an epoxy resin-based adhesive, or a resin additive.

Through the above steps, a semiconductor device which has a memory element and an antenna and which can input and output data without contact can be manufactured.

In the semiconductor device given in this embodiment mode, by melting and planarizing the semiconductor layer which is formed over the insulating layer provided with the projection portion, the source region or the drain region with a thickness larger than that of a channel formation region is formed. The thickness of the source region or the drain region is large compared with that of the channel formation region, which is advantageous to the recovery of crystallinity in the heat treatment which is conducted for thermal activation of an impurity element after the addition of the impurity element by an ion doping method or the like. Furthermore, an increase in resistance of the source region or the drain region can be suppressed. Subthreshold swing can be lowered, and a decrease in the on-state current can be suppressed because the thickness of the channel formation region is small compared with the thickness of the source region or the drain region. Since the planarization of the semiconductor layer is realized by melting the semiconductor, a semiconductor device can be manufactured easily without increasing the number of processes. Accordingly, a highly responsive semiconductor device in which subthreshold swing is low and a decrease in the on-state current is suppressed can be manufactured.

Embodiment Mode 3

In this embodiment mode, an example of a block diagram of a semiconductor device which is capable of inputting and outputting data without contact will be described. According to its usage mode, a semiconductor device capable of inputting and outputting data without contact may also be referred to as an RFID tag, an ID tag, an IC tag, an IC chip, an RF tag, a wireless tag, an electronic tag, or a wireless chip.

Figure 12:
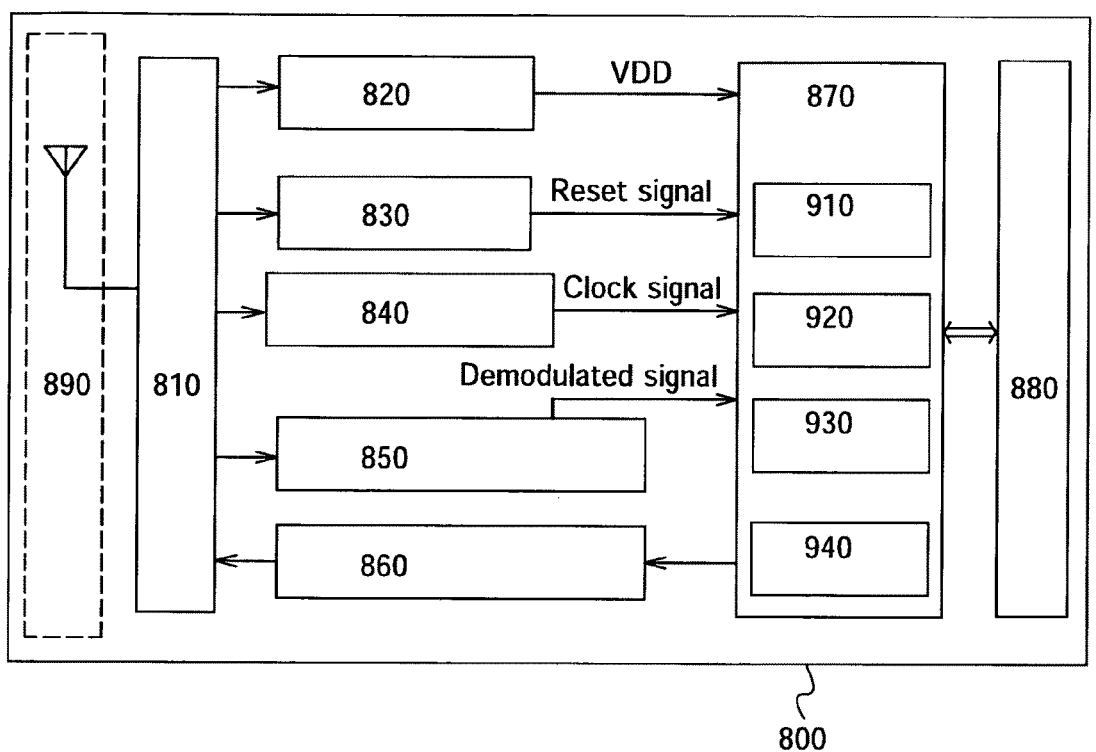
FIG. 12 is a block diagram illustrating a structure of a semiconductor device of the present invention.

FIG. 12 shows a block diagram for describing a structure of a semiconductor device which is capable of inputting and outputting data without contact. A semiconductor device 800 which is capable of inputting and outputting data without contact has a function of communicating data with a reader/writer without contact and includes a high-frequency circuit 810, a power supply circuit 820, a reset circuit 830, a clock generation circuit 840, a data demodulation circuit 850, a data modulation circuit 860, a control circuit 870 which controls another circuit, a memory circuit 880, and an antenna 890. Note that the memory circuit 880 shown in FIG. 12 corresponds to the memory portion 202 shown in FIG. 7A. The high-frequency circuit 810, the power supply circuit 820, the reset circuit 830, the clock generation circuit 840, the data demodulation circuit 850, the data modulation circuit 860, and the control circuit 870 shown in FIG. 12 correspond to the integrated circuit portion 201 shown in FIG. 7A. The antenna 890 shown in FIG. 12 corresponds to the antenna 303 shown in FIG. 7A.

The high-frequency circuit 810 is a circuit which receives a signal from the antenna 890, and outputs a signal, which is received from the data modulation circuit 860, from the antenna 890. The power supply circuit 820 is a circuit which generates a power supply potential from a receive signal. The reset circuit 830 is a circuit which generates a reset signal from a receive signal. The clock generation circuit 840 is a circuit which generates various clock signals based on a receive signal input from the antenna 890. The data demodulation circuit 850 is a circuit which demodulates a receive signal and outputs the demodulated signal to the control circuit 870. The data modulation circuit 860 is a circuit which modulates a signal received from the control circuit 870.

Further, as the control circuit 870, a code extraction circuit 910, a code determination circuit 920, a CRC determination circuit 930, and an output unit circuit 940 are provided, for example. The code extracting circuit 910 is a circuit which extracts each of a plurality of codes included in an instruction transmitted to the control circuit 870. The code determination circuit 920 is a circuit which determines the content of an instruction by comparing an extracted code with a code which corresponds to a reference. The CRC determination circuit 930 is a circuit which detects the presence of transmission errors and the like based on a determined code.

Next, an example of an operation of the above-mentioned semiconductor device will be described. First, a radio signal is received by the antenna 890. The radio signal is transmitted to the power supply circuit 820 via the high-frequency circuit 810, and a high power supply potential (hereinafter referred to as VDD) is generated. The VDD is supplied to circuits included in the semiconductor device 800. A signal transmitted to the data demodulation circuit 850 via the high-frequency circuit 810 is demodulated (hereinafter, this signal is referred to as a demodulated signal). Further, signals that pass through the reset circuit 830 and the clock generation circuit 840 via the high-frequency circuit 810, and the demodulated signal are transmitted to the control circuit 870. The signals transmitted to the control circuit 870 are analyzed by the code extracting circuit 910, the code determination circuit 920, the CRC determination circuit 930, and the like. Then, based on the analyzed signals, information in the semiconductor device stored in the memory circuit 880 is output. The output information of the semiconductor device passes through the output unit circuit 940 and is encoded. Further, the encoded information of the semiconductor device 800 passes through the data modulation circuit 860 and is superposed on a radio signal and transmitted by the antenna 890. Note that a low power supply potential (hereinafter referred to as VSS) is common in the plurality of circuits included in the semiconductor device 800, and GND can be used as VSS. Further, the high-frequency circuit 810, the power supply circuit 820, the reset circuit 830, the clock generation circuit 840, the data demodulation circuit 850, the data modulation circuit 860, the control circuit 870 for controlling another circuit, the memory circuit 880, and the like can be formed using an above-described semiconductor element; representatively, the thin film transistor.

When a signal is transmitted from a reader/writer to the semiconductor device 800 and a signal transmitted from the semiconductor device 800 is received by the reader/writer in this manner, data in the semiconductor device can be read.

Further, the semiconductor device 800 may be one in which a power source (e.g., a battery) is not included and a power supply voltage is supplied to circuits by using electromagnetic waves. The semiconductor device 800 may also be one in which a power source (e.g., a battery) is included, and a power supply voltage is supplied to circuits by using both electromagnetic waves and the power source (battery).

Figure 13A:
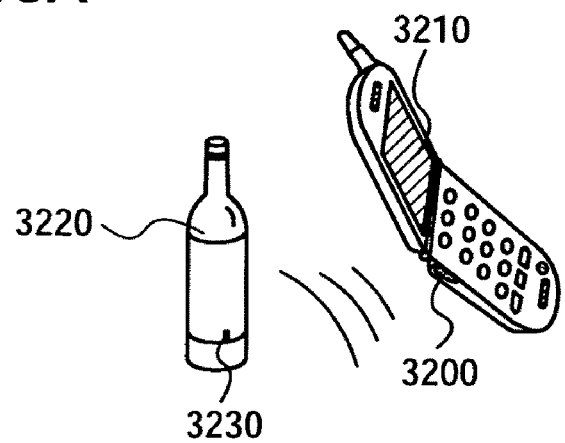
FIGS. 13A and 13B are diagrams illustrating a usage mode of a semiconductor device of the present invention.
Figure 13B:
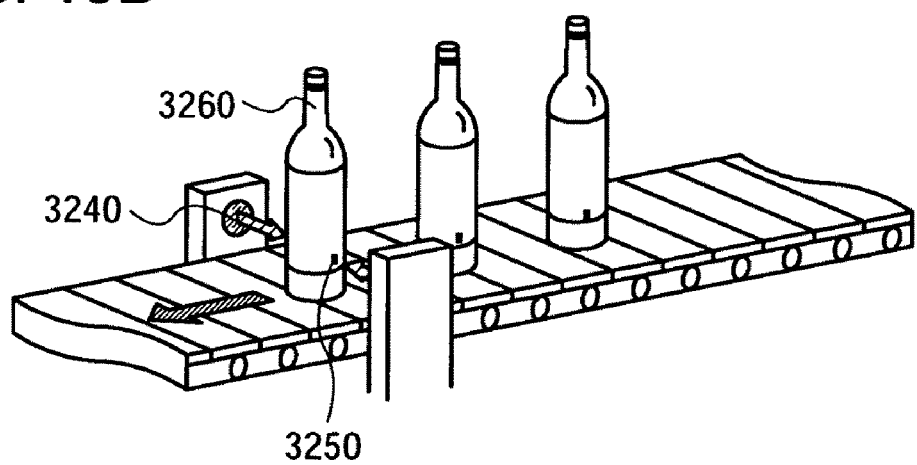

Next, an example of a usage mode of a semiconductor device capable of inputting and outputting data without contact will be described with reference to FIGS. 13A and 13B. A side surface of a mobile terminal which includes a display portion 3210 is provided with a reader/writer 3200. A side surface of a product 3220 is provided with a semiconductor device 3230 (FIG. 13A). When the reader/writer 3200 is held up to the semiconductor device 3230 included in the product 3220, the display portion 3210 displays information about the product such as its materials, its place of production, inspection results for each production step, a history of the distribution process, and a description of the product. Further, when a product 3260 is conveyed by a conveyer belt, the product 3260 can be inspected by using a reader/writer 3240 and a semiconductor device 3250 with which the product 3260 is provided (FIG. 13B). When the semiconductor device is used in a system in this manner, information can be obtained easily, and higher performance and higher added value can be provided to a variety of products.

A semiconductor device of this embodiment mode can be used by being provided in, for example, paper money, coins, securities, certificates, bearer bonds, packing containers, books, recording media, personal belongings, vehicles, food items, clothes, healthcare items, articles for daily life, medicals, electronic devices, and the like. For these examples, modes of use of the semiconductor device of the present invention will be described with reference to FIGS. 14A to 14E and FIGS. 15A to 15D.

Figure 14A:
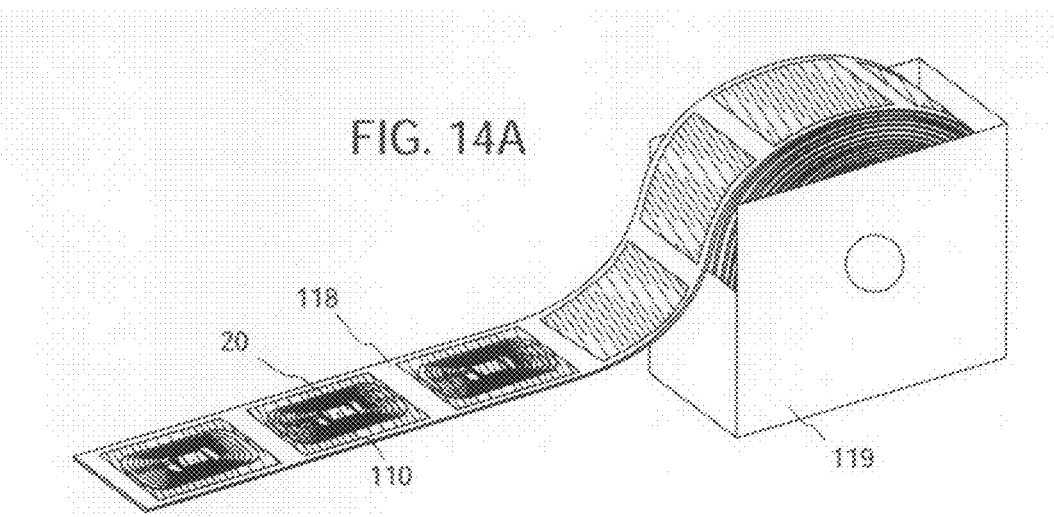
FIGS. 14A to 14E are diagrams illustrating a usage mode of a semiconductor device of the present invention.

FIG. 14A shows an example of a state of completed products of ID labels of the present invention. On a label board (separate paper) 118, a plurality of ID labels (ID sticker) 20 with built-in IC chips 110 are formed. The ID labels 20 are put in a box 119. On the ID label 20, information on a commercial product or service (for example, a name of the product, a brand, a trademark, a trademark owner, a seller, a manufacturer, and the like) is written, while an ID number that is unique to the commercial product (or the kind of the commercial product) is assigned to the built-in IC chip 110 to make it possible to easily figure out forgery, infringement of intellectual property rights such as a patent and a trademark, and illegality such as unfair competition. In addition, a lot of information that is too much to be written clearly on a container of the commercial product or the label, for example, the production area, selling area, quality, raw material, efficacy, use, quantity, shape, price, production method, directions for use, time of the production, time of the use, expiration date, instructions of the commercial product, information on the intellectual property of the commercial product, and the like can be input in the IC chip 110 so that a transactor and a consumer can access the information using a simple reader. While rewriting, deleting, and the like of the information can be easily conducted by the producer, a transactor or consumer is not allowed to conduct rewriting, deleting, and the like of the information.

Figure 14B:
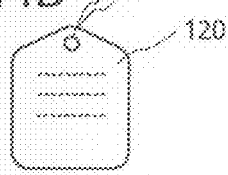

FIG. 14B shows an ID tag 120 with a built-in IC chip of the present invention. By mounting the ID tag on commercial products, the management of the commercial products becomes easier. For example, in the case where the commercial product is stolen, the thief can be figured out quickly by tracing the pathway of the commercial product. In this way, by providing the ID tag, commercial products that are excellent in so-called traceability (traceability means that preparation is made for smoothly grasping the cause of a problem, which may occur at each complicated stage of manufacture and distribution, by tracing the pathway) can be distributed.

Figure 14C:
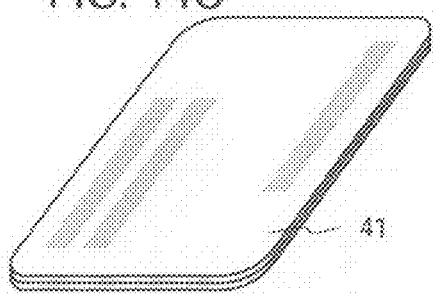

FIG. 14C shows an example of a state of a completed product of an ID card 41 of the present invention. The ID card includes all kinds of cards such as a cash card, a credit card, a prepaid card, an electronic ticket, electronic money, a telephone card, and a membership card.

Figure 14D:
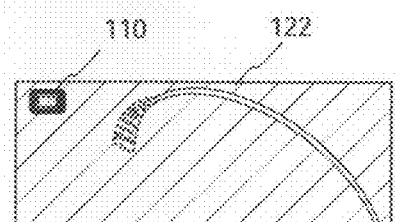

FIG. 14D shows an example of a state of a completed product of a bearer bond 122 with the built-in IC chip 110 of the present invention. The bearer bonds include, but not limited to of course, stamps, tickets, admission tickets, merchandise coupons, book coupons, stationery coupons, beer coupons, rice coupons, various gift coupons, and various service coupons. In addition, an IC chip can be provided in securities such as a check, a bill, and a promissory note, certificates such as a driver's license and a resident card, or the like, not limited to the bearer bonds.

Figure 14E:
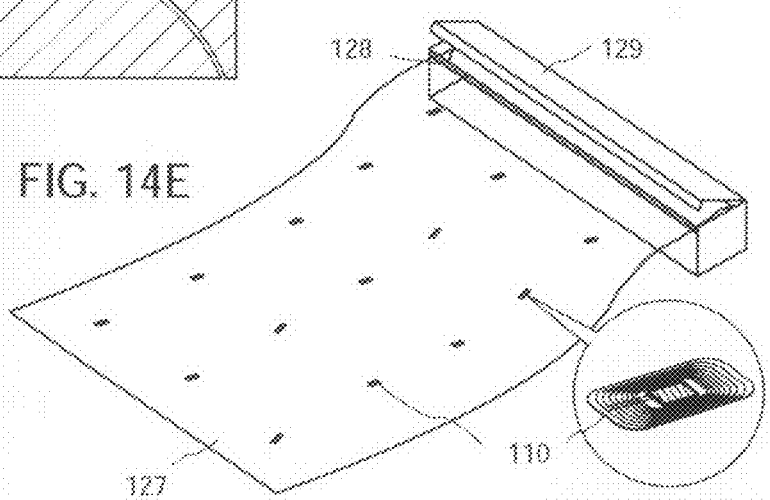

FIG. 14E shows a wrapping film 127 with the built-in IC chips 110, for wrapping a commercial product. The wrapping film 127 can be manufactured, for example, by scattering IC chips arbitrarily on a lower film and covering them with an upper film. The wrapping film 127 is put in a box 129, and the desired amount of the film can be cut away with a cutter 128 and used. The material of the wrapping film 127 is not particularly limited. For example, materials such as a thin film resin, an aluminum foil, and paper can be used.

Figure 15A:
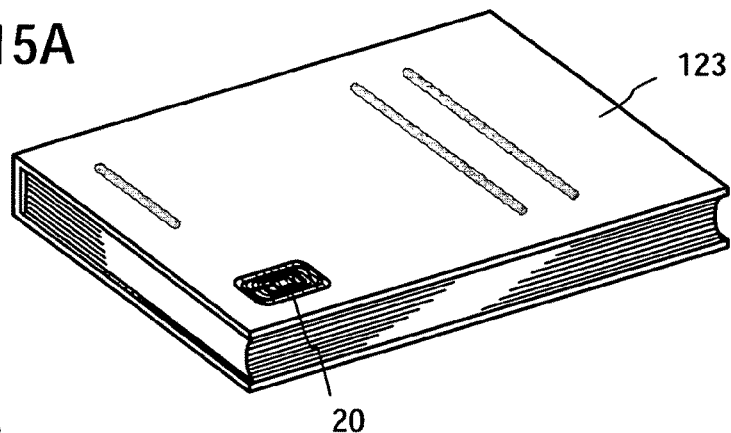
FIGS. 15A to 15D are diagrams illustrating a usage mode of a semiconductor device of the present invention.
Figure 15B:
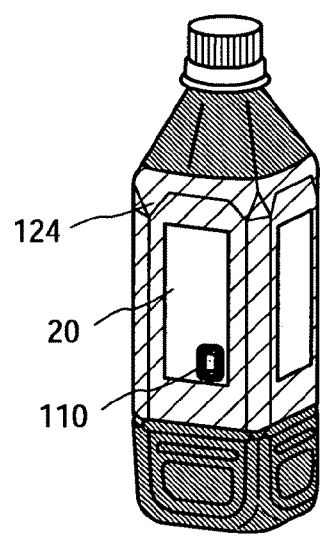

FIG. 15A shows a book 123 to which the ID label 20 of the present invention is attached, and FIG. 15B shows a plastic bottle 124 to which the ID label 20 with the built-in IC chip 110 of the present invention is attached. Note that the goods provided with ID labels are not limited to these. The ID label may be attached to various goods such as packing containers such as paper for packing a box lunch; recording media such as DVD software and video tapes; vehicles including wheeled vehicles such as bicycles and ships; personal belongings such as bags and glasses; food items such as foods and beverages; apparel such as clothing and footwear; healthcare items such as medical devices and health appliances; articles for daily life such as furniture and lighting systems; medical products such as medicines and agricultural chemicals; and electronic devices such as liquid crystal display devices, EL display devices, television sets (television receivers, flat-screen television receivers), and cellular phones. The ID label 20 that is used in the present invention is quite thin; therefore, when the ID label 20 is mounted on an article such as the book, the function or design of the article is adversely affected. Furthermore, in the case where the IC chip 110 of the present invention can input and output data without contact, an antenna can be formed in an integrated manner as part of a thin film integrated circuit to make it easier to transfer the thin film integrated circuit directly to a commercial product with a curved surface.

Figure 15C:
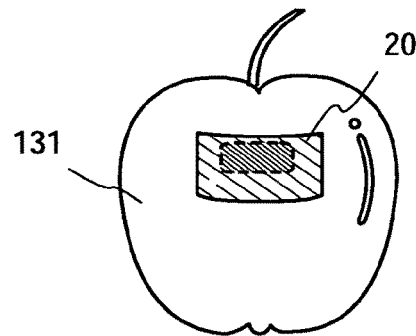
Figure 15D:
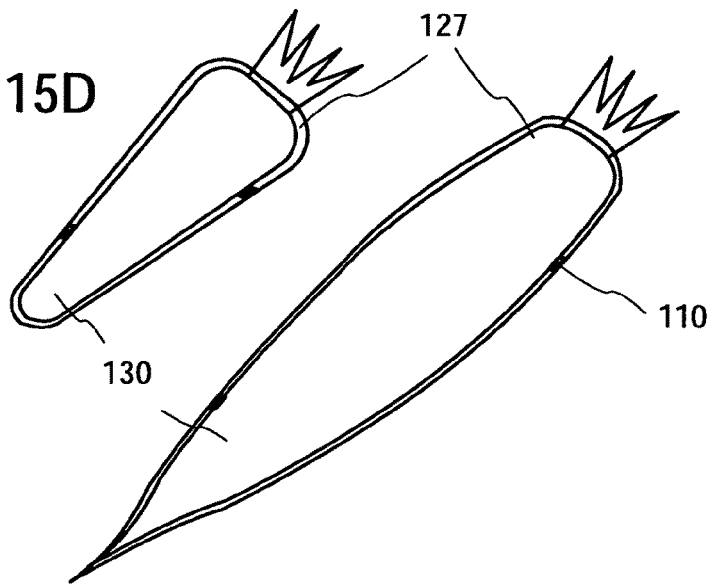
Figure 16A:
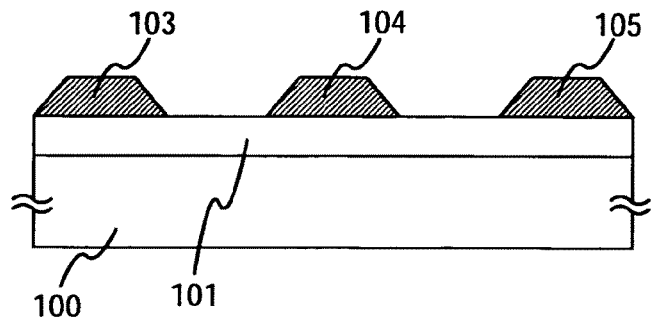
FIGS. 16A to 16D are diagrams illustrating a structure of a semiconductor device of the present invention.
Figure 16B:
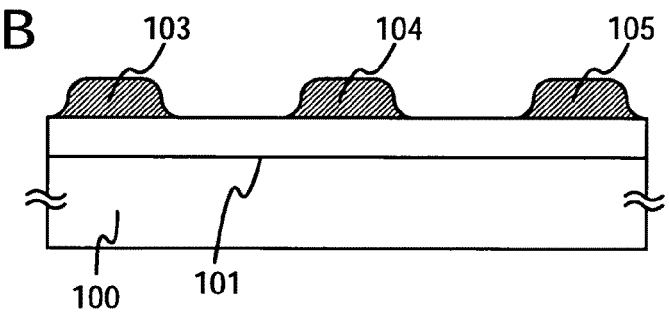
Figure 16C:
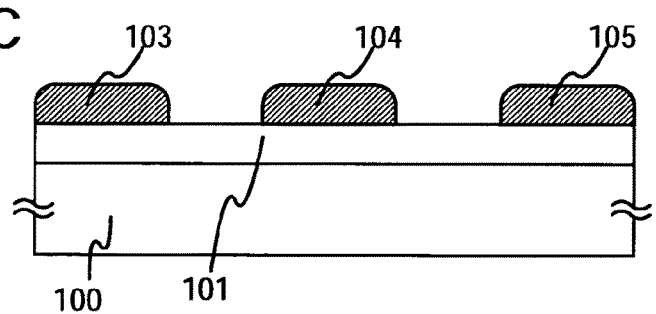
Figure 16D:
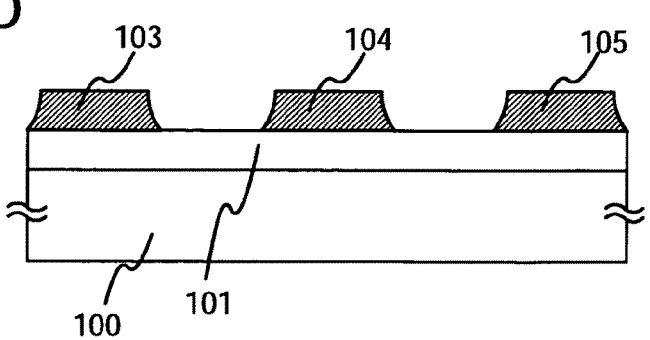

FIG. 15C shows a state in which the ID label 20 is directly attached to fresh food such as a fruit 131. In addition, FIG. 15D shows an example in which fresh food such as a vegetable 130 is wrapped in the wrapping film 127 that has the built-in IC chip 110. When an ID label is attached to a commercial product, the label may be peeled off. However, when the commercial product is wrapped in wrapping films, it is difficult to peel off the wrapping film, which brings some merit in regard to security.

When an RFID tag is provided for paper money, coins, securities, certificates, bearer bonds, and the like, forgery of those can be prevented. When an RFID tag is provided in packing containers, books, recording media, personal belongings, food items, clothes, articles for daily life, electronic devices, and the like, inspection systems, rental systems, and the like can be used more efficiently. When an RFID tag is provided in vehicles, healthcare items, medical products, and the like, forgery and theft thereof can be prevented and medical products can be prevented from being taken in the wrong manner. The RFID tag is attached to a surface of an object or incorporated in an object. For example, the RFID tag may be incorporated in the paper of a book or an organic resin of a package.

In this manner, when the RFID tag is equipped in containers for packages, books, recording media, personal belongings, foods, clothes, articles for daily life, electronic devices, and the like, inspection system, rental system, and the like can be performed more efficiently. The RFID tag also prevents vehicles, healthcare items, medical products, and the like from being forged or stolen. In addition, since the semiconductor device of the present invention is thin, when the RFID tag is implanted into creatures such as animals, each creature can be identified easily. For example, when the RFID tag is implanted in creatures such as domestic animals, the year of birth, sex, breed, and the like can be easily identified.

As described above, the semiconductor device of this embodiment mode can be used for any product.

This application is based on Japanese Patent Application serial No. 2007-058582 filed with Japan Patent Office on Mar. 8, 2007, the entire contents of which are hereby incorporated by reference.

What is claimed is:

1. A method for manufacturing a semiconductor device comprising:
   forming a first insulating layer over an insulating substrate;
   forming a first depression portion and a second depression portion with a projection portion therebetween by forming a second insulating layer over the insulating substrate;
   forming an amorphous semiconductor layer over the first depression portion, the second depression portion, and the projection portion;
   forming a crystalline semiconductor layer by melting the amorphous semiconductor layer so as to make the amorphous semiconductor layer material flow from the projection portion to the depression portions and crystallize; and
   forming one of a source region and a drain region and the other of the source region and the drain region in a first part and in a second part of a first region of the crystalline semiconductor layer, respectively, by adding an impurity element to the first region of the crystalline semiconductor layer without adding the impurity element to a second region of the crystalline semiconductor layer,
   wherein the first region of the crystalline semiconductor layer is a region where the crystalline semiconductor layer overlaps the first depression portion and the second depression portion,
   wherein the second region of the crystalline semiconductor layer is a region where the crystalline semiconductor layer overlaps the projection portion,
   wherein the first region and the second region of the crystalline semiconductor layer have a top surface substantially at a same level, and
   wherein the first part and the second part of the crystalline semiconductor are situated in the first depression portion and in the second depression portion, respectively.

2. The method for manufacturing a semiconductor device according to claim 1,
   wherein the second insulating layer is formed in a stripe pattern.

3. The method for manufacturing a semiconductor device according to claim 1,
   wherein a thickness of the second region of the crystalline semiconductor layer is arranged to be greater than or equal to 10 nm and less than or equal to 50 nm.

4. The method for manufacturing a semiconductor device according to claim 1,
   wherein a thickness of the second region of the crystalline semiconductor layer is arranged to be less than a thickness of the first region of the crystalline semiconductor layer.

5. A method for manufacturing a semiconductor device comprising:
   forming a first insulating layer over an insulating substrate;

forming a first depression portion and a second depression portion with a projection portion therebetween by forming a second insulating layer over the insulating substrate;

forming an amorphous semiconductor layer over the first depression portion, the second depression portion, and the projection portion;

forming a crystalline semiconductor layer having a planarized surface on the side opposite to the insulating substrate by melting the amorphous semiconductor layer so as to make the amorphous semiconductor layer material flow from the projection portion to the depression portions and crystallize; and forming one of a source region and a drain region and the other of the source region and the drain region in a first part and in a second part of a first region of the crystalline semiconductor layer, respectively, by adding an impurity element to the first region of the crystalline semiconductor layer without adding the impurity element to a second region of the crystalline semiconductor layer, wherein the first region of the crystalline semiconductor layer is a region where the crystalline semiconductor layer overlaps the first depression portion and the second depression portion, and wherein the second region of the crystalline semiconductor layer is a region where the crystalline semiconductor layer overlaps the projection portion, wherein the first region and the second region of the crystalline semiconductor layer have a top surface substantially at a same level, and wherein the first part and the second part of the crystalline semiconductor are situated in the first depression portion and in the second depression portion, respectively.

6. The method for manufacturing a semiconductor device according to claim 5,
wherein the second insulating layer is formed in a stripe pattern.

7. The method for manufacturing a semiconductor device according to claim 5,
wherein a thickness of the second region of the crystalline semiconductor layer is arranged to be greater than or equal to 10 nm and less than or equal to 50 nm.

8. The method for manufacturing a semiconductor device according to claim 5,
wherein a thickness of the second region of the crystalline semiconductor layer is arranged to be less than a thickness of the first region of the crystalline semiconductor layer.

9. A method for manufacturing a semiconductor device comprising:
forming a first insulating layer over an insulating substrate;
forming a first depression portion and a second depression portion with a projection portion therebetween by forming a second insulating layer over the insulating substrate;
forming an amorphous semiconductor layer over the first depression portion, the second depression portion, and the projection portion;
forming a crystalline semiconductor layer by scanning the amorphous semiconductor layer with a laser beam so as to make the amorphous semiconductor layer material flow from the projection portion to the depression portions and crystallize; and
forming one of a source region and a drain region and the other of the source region and the drain region in a first part and in a second part of a first region of the crystalline semiconductor layer, respectively, by adding an impurity element to the first region of the crystalline semiconductor layer without adding the impurity element to a second region of the crystalline semiconductor layer, wherein the first region of the crystalline semiconductor layer is a region where the crystalline semiconductor layer overlaps the first depression portion and the second depression portion, and wherein the second region of the crystalline semiconductor layer is a region where the crystalline semiconductor layer overlaps the projection portion, wherein the first region and the second region of the crystalline semiconductor layer have a top surface substantially at a same level, and wherein the first part and the second part of the crystalline semiconductor are situated in the first depression portion and in the second depression portion, respectively.

10. The method for manufacturing a semiconductor device according to claim 9,
wherein the second insulating layer is formed in a stripe pattern.

11. The method for manufacturing a semiconductor device according to claim 9,
wherein a thickness of the second region of the crystalline semiconductor layer is arranged to be greater than or equal to 10 nm and less than or equal to 50 nm.

12. The method for manufacturing a semiconductor device according to claim 9,
wherein a thickness of the second region of the crystalline semiconductor layer is arranged to be less than a thickness of the first region of the crystalline semiconductor layer.

13. The method for manufacturing a semiconductor device according to claim 9,
wherein the laser beam is a linear beam.

14. The method for manufacturing a semiconductor device according to claim 9,
wherein the laser beam is one selected from a continuous wave laser beam and a laser beam oscillated at a repetition rate of 10 MHz or more.

15. The method for manufacturing a semiconductor device according to claim 9,
wherein laser beam is a linear beam,
wherein the second insulating layer is formed in a stripe pattern, and
wherein the scanning of the amorphous semiconductor layer is performed so that the long side of the linear beam crosses with a direction in which the projection portion extends and the laser beam is scanned in the direction in which the projection portion extends.

16. A method for manufacturing a semiconductor device comprising:
forming a first insulating layer over an insulating substrate;
forming a first depression portion and a second depression portion with a projection portion therebetween by forming a second insulating layer over the insulating substrate;
forming an amorphous semiconductor layer over the first depression portion, the second depression portion, and the projection portion;
forming a crystalline semiconductor layer having a planarized surface on the side opposite to the insulating substrate by scanning the amorphous semiconductor layer with a laser beam so as to melt the amorphous semiconductor layer and make the amorphous semiconductor layer material flow from the projection portion to the depression portions and crystallize; and forming one of a source region and a drain region and the other of the source region and the drain region in a first part and in a second part of a first region of the crystalline semiconductor layer, respectively, by adding an impurity element to the first region of the crystalline semiconductor layer without adding the impurity element to a second region of the crystalline semiconductor layer, wherein the first region of the crystalline semiconductor layer is a region where the crystalline semiconductor layer overlaps the first depression portion and the second depression portion, and wherein the second region of the crystalline semiconductor layer is a region where the crystalline semiconductor layer overlaps the projection portion, wherein the first region and the second region of the crystalline semiconductor layer have a top surface substantially at a same level, and wherein the first part and the second part of the crystalline semiconductor are situated in the first depression portion and in the second depression portion, respectively.

17. The method for manufacturing a semiconductor device according to claim 16,
wherein the second insulating layer is formed in a stripe pattern.

18. The method for manufacturing a semiconductor device according to claim 16,
wherein a thickness of the second region of the crystalline semiconductor layer is arranged to be greater than or equal to 10 nm and less than or equal to 50 nm.

19. The method for manufacturing a semiconductor device according to claim 16,
wherein a thickness of the second region of the crystalline semiconductor layer is arranged to be less than a thickness of the first region of the crystalline semiconductor layer.

20. The method for manufacturing a semiconductor device according to claim 16,
wherein the laser beam is a linear beam.

21. The method for manufacturing a semiconductor device according to claim 16,
wherein the laser beam is one selected from a continuous wave laser beam and a laser beam oscillated at a repetition rate of 10 MHz or more.

22. The method for manufacturing a semiconductor device according to claim 16,
wherein laser beam is a linear beam,
wherein the second insulating layer is formed in a stripe pattern, and
wherein the scanning of the amorphous semiconductor layer is performed so that the long side of the linear beam crosses with a direction in which the projection portion extends and the laser beam is scanned in the direction in which the projection portion extends.

* * * * *